United States Patent
Otake

(10) Patent No.: US 12,348,220 B2
(45) Date of Patent: Jul. 1, 2025

(54) NITRIDE SEMICONDUCTOR MODULE

(71) Applicant: ROHM CO., LTD., Kyoto (JP)

(72) Inventor: Hirotaka Otake, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 161 days.

(21) Appl. No.: 18/357,187

(22) Filed: Jul. 24, 2023

(65) Prior Publication Data

US 2024/0039523 A1 Feb. 1, 2024

(30) Foreign Application Priority Data

Jul. 27, 2022 (JP) .................. 2022-119515

(51) Int. Cl.
| | | |
|---|---|---|
| *H03K 17/00* | (2006.01) | |
| *H01L 23/31* | (2006.01) | |
| *H03K 17/041* | (2006.01) | |
| *H10D 30/47* | (2025.01) | |
| *H10D 62/85* | (2025.01) | |
| *H10D 64/00* | (2025.01) | |
| *H03K 17/687* | (2006.01) | |

(52) U.S. Cl.
CPC ... *H03K 17/04106* (2013.01); *H01L 23/3171* (2013.01); *H10D 30/475* (2025.01); *H10D 62/8503* (2025.01); *H10D 64/111* (2025.01); *H03K 17/687* (2013.01)

(58) Field of Classification Search
CPC ............. H01L 23/3171; H01L 29/2003; H01L 29/402; H01L 29/7786; H03K 17/04106; H03K 17/687
See application file for complete search history.

(56) References Cited

U.S. PATENT DOCUMENTS

| | | | | |
|---|---|---|---|---|
| 2012/0275076 A1* | 11/2012 | Shono | ................... | H01M 10/44 361/86 |
| 2017/0104091 A1 | 4/2017 | Tanaka | | |
| 2017/0285095 A1* | 10/2017 | Yanagi | ................... | G06F 30/367 |
| 2021/0099071 A1* | 4/2021 | Otake | ................... | H02M 7/003 |

FOREIGN PATENT DOCUMENTS

JP 2017-073506 A 4/2017

* cited by examiner

*Primary Examiner* — Tuan T Lam
(74) *Attorney, Agent, or Firm* — XSENSUS LLP

(57) ABSTRACT

A nitride semiconductor module includes a nitride semiconductor device, forming a transistor, and a control circuit. The nitride semiconductor device includes a control electrode arranged on a passivation layer between gate and drain electrodes. The control circuit generates first and second control voltages. The first control voltage, which shifts between a first voltage level and a lower second voltage level, controls a voltage applied between the gate and source electrodes. The second control voltage, which shifts between a third voltage and a lower fourth voltage level, is applied between the control and source electrodes. The control circuit generates the first and second control voltages during a turn-off operation of the transistor so that a shifting completion time of the second control voltage from the third to fourth voltage level is earlier than that of the first control voltage from the first to second voltage level.

20 Claims, 9 Drawing Sheets

NITRIDE SEMICONDUCTOR MODULE

CROSS-REFERENCE TO RELATED APPLICATION

This application claims priority to Japanese Patent Application No. 2022-119515 filed on Jul. 27, 2022, the entire content of which is incorporated herein by reference.

BACKGROUND

1. Field

This disclosure relates to a nitride semiconductor module.

2. Description of Related Art

High-electron-mobility transistors (HEMTs) are now being commercialized. An HEMT is one type of field effect transistor (FET) that uses a III-V semiconductor such as gallium nitride (GaN). A HEMT uses two-dimensional electron gas (2DEG), formed near a semiconductor heterojunction interface, as a conduction path (channel). Japanese Laid-Open Patent Publication No. 2017-73506 describes one example of a nitride semiconductor device. A power transistor formed by a HEMT is a device that has a lower ON resistance and is operable at a higher speed and higher frequency than a typical silicon (Si) power transistor.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
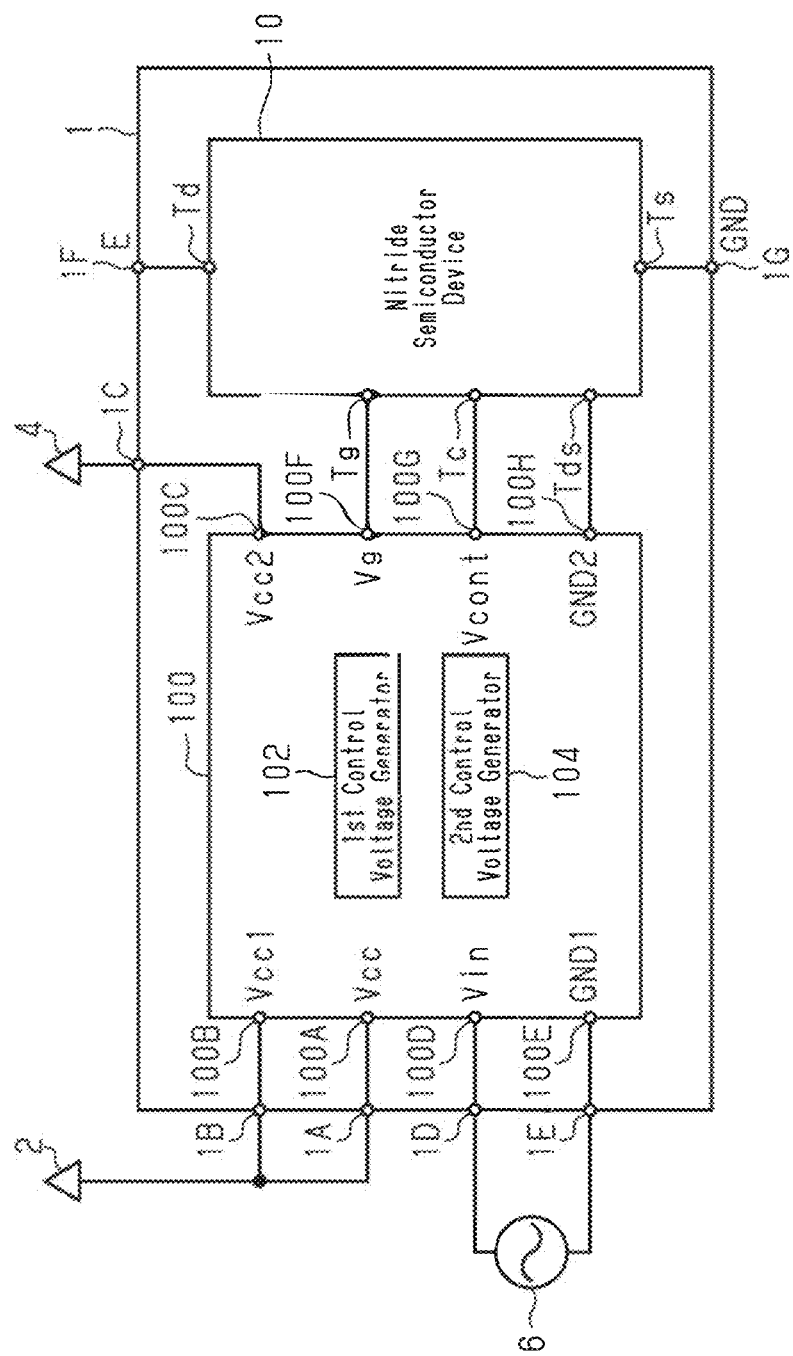
FIG. 1 is a schematic block diagram illustrating an exemplary nitride semiconductor module in accordance with a first embodiment.

Several embodiments of a semiconductor device in accordance with the present disclosure will now be described with reference to the accompanying drawings. In the drawings, elements are illustrated for simplicity and clarity and have not necessarily been drawn to scale. To facilitate understanding, hatching lines may not be shown in the cross-sectional drawings. The accompanying drawings illustrate exemplary embodiments in accordance with the present disclosure and are not intended to limit the present disclosure.

This detailed description provides a comprehensive understanding of the methods, apparatuses, and/or systems described. Exemplary embodiments may have different forms, and are not limited to the examples described.

First Embodiment

An exemplary nitride semiconductor module 1 in accordance with a first embodiment will now be described with reference to FIGS. 1 to 7.

1. Overview of Nitride Semiconductor Module

FIG. 1 is a schematic block diagram illustrating the nitride semiconductor module 1. The nitride semiconductor module 1 includes a nitride semiconductor device 10 and a control circuit 100. The nitride semiconductor device 10 is a HEMT using a nitride semiconductor. The control circuit 100 includes a first control voltage generator 102 and a second control voltage generator 104.

The nitride semiconductor module 1 may include, for example, seven external terminals 1A, 1B, 1C, 1D, 1E, 1F, and 1G. The external terminals 1A, 1B, and 1C correspond to power terminals of the control circuit 100. The external terminals 1A and 1B are connected to a first power source 2 that supplies a first voltage. The external terminal 1C is connected to a fourth power source 4 that supplies a second voltage. The first voltage and the second voltage may be the same or be different. In the first embodiment, the first voltage and the second voltage are the same, for example, 5 V.

In the example of FIG. 1, the first voltage is supplied from the first power source 2, as voltage Vcc for driving the control circuit 100, via the external terminal 1A to the control circuit 100. Further, the first voltage is provided from the first power source 2, as voltage Vcc1 for generating a first control voltage Vg with the first control voltage generator 102, via the external terminal 1B to the control circuit 100. The second voltage is supplied from the fourth power source 4, as voltage Vcc2 for generating second control voltage Vcont with the second control voltage generator 104, via the external terminal 1C to the control circuit 100.

The external terminals 1D and 1E are connected to a signal source 6 that provides control signals for the control circuit 100. For example, voltage GND1 having a ground voltage level is applied to the external terminal 1E, and voltage Vin having a positive voltage level is applied to the external terminal 1D. The external terminals 1F and 1G correspond to power terminals of the nitride semiconductor device 10. The external terminal 1F is connected to a power source 8 (refer to FIG. 2) that supplies voltage E. For instance, when the nitride semiconductor device 10 is used as a power transistor HEMT, the voltage E may be, for example, 48 V. The external terminal 1G may be connected to ground.

The control circuit 100 may include, for example, eight terminals 100A, 100B, 100C, 100D, 100E, 100F, 100G, and 100H. The terminals 100A, 100B, 100C, and 100H correspond to power terminals. The terminals 100D and 100E correspond to signal input terminals, and the terminals 100F and 100G correspond to signal output terminals. The terminals 100A, 100B, 100C, 100D, and 100E are connected to the external terminals 1A, 1B, 1C, 1D, and 1E, respectively.

The first control voltage Vg is output from the first control voltage generator 102 to the terminal 100F. The second control voltage Vcont is output from the second control voltage generator 104 to the terminal 100G. Voltage GND2 having a ground potential is applied to the terminal 100H, which is connected to the nitride semiconductor device 10.

The nitride semiconductor device 10 may include multiple (e.g., five) terminals. In the example of FIG. 1, the nitride semiconductor device 10 includes a drain terminal Td, a source terminal Ts, a gate terminal Tg, a control terminal Tc, and a driver source terminal Tds. Voltage E is applied to the drain terminal Td via the external terminal 1F. The source terminal Ts may be grounded via the external terminal 1G. The gate terminal Tg is connected to the terminal 100F of the control circuit 100 and supplied with the first control voltage Vg. The control terminal Tc is connected to the terminal 100G of the control circuit 100 and supplied with the second control voltage Vcont.

The driver source terminal Tds applies the voltage GND2, which eliminates the effect of electromotive force caused by the parasitic inductance coupled to the source terminal Ts in the nitride semiconductor module 1, to the control circuit 100. The driver source terminal Tds is also referred to as the source sense terminal. The driver source terminal Tds may be omitted.

The first control voltage generator 102 generates the first control voltage Vg based on a control signal from the signal source 6. The first control voltage Vg is, for example, a pulse voltage (refer to FIG. 5) and variable between a first voltage level V1 and a second voltage level V2 that is lower than the first voltage level V1. In one example, the first voltage level V1 may be a positive voltage level (e.g., 5 V) corresponding to the voltage Vcc1. The second voltage level V2 may be a ground voltage level (0 V) corresponding to the voltage GND2 detected at the driver source terminal Tds.

The second control voltage generator 104 generates the second control voltage Vcont based on a control signal from the signal source 6. The second control voltage Vcont is, for example, a pulse voltage (refer to FIG. 5) and variable between a third voltage level V3 and a fourth voltage level V4 that is lower than the third voltage level V3. In one example, the third voltage level V3 may be ground voltage level (0 V) corresponding to the voltage GND2 detected at the driver source terminal Tds. The fourth voltage level V4 may be a negative voltage level (e.g., −5V) obtained by inverting the polarity of the voltage Vcc2.

2. Structure of Entire Nitride Semiconductor Device

Figure 2:
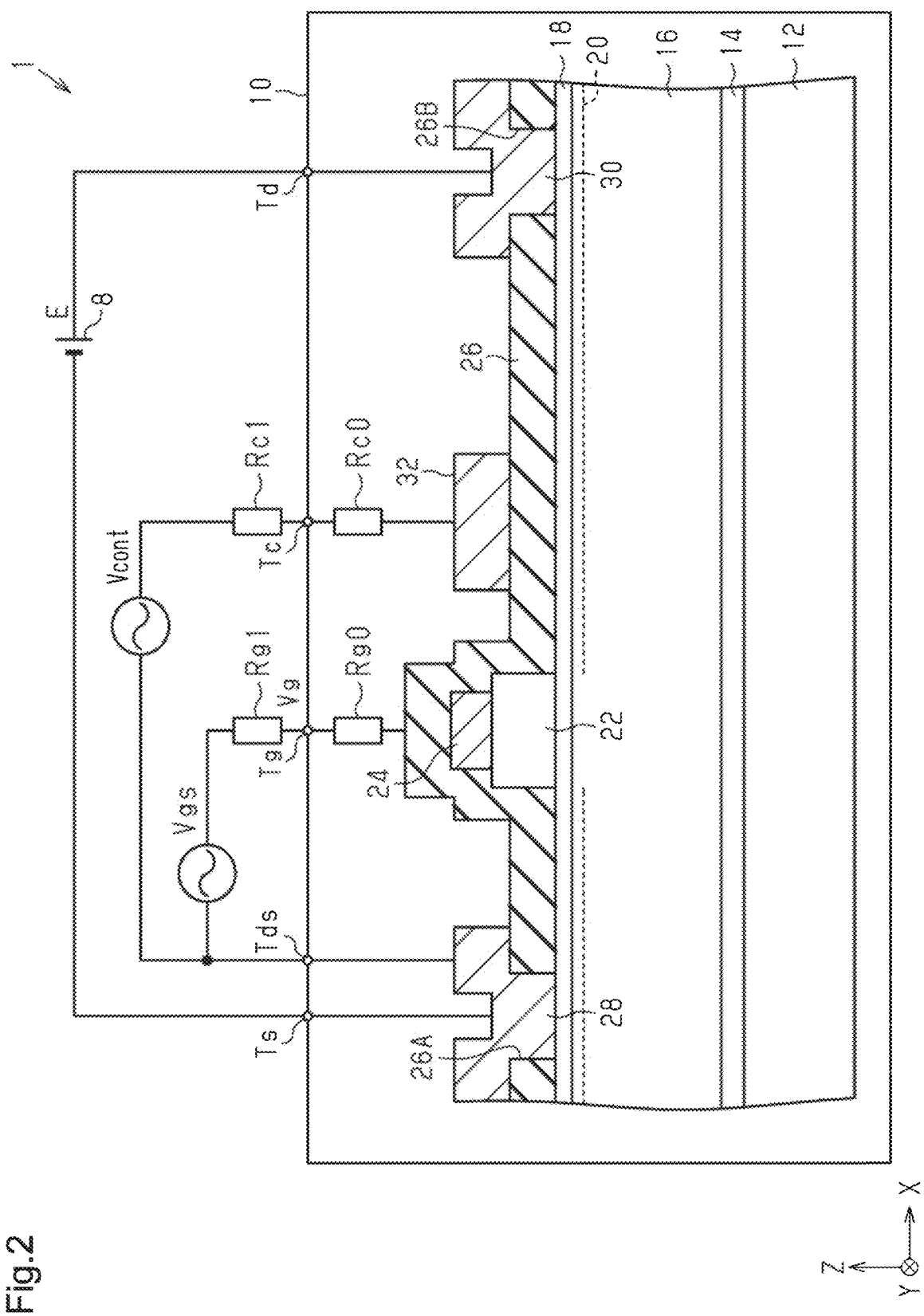
FIG. 2 is a diagram illustrating applied voltages together with the cross-sectional structure of an exemplary nitride semiconductor device in the first embodiment.

With reference to FIG. 2, the structure of the entire nitride semiconductor device 10 will now be described. FIG. 2 is a diagram illustrating voltages together with the cross-sectional structure of the exemplary nitride semiconductor device 10 formed as a HEMT.

The nitride semiconductor device 10 is, for example, a HEMT using GaN. The nitride semiconductor device 10 includes a semiconductor substrate 12, a buffer layer 14 formed on the semiconductor substrate 12, an electron transit layer 16 formed on the buffer layer 14, and an electron supply layer 18 formed on the electron transit layer 16.

The semiconductor substrate 12 may be formed from Si, silicon carbide (SiC), GaN, sapphire, or another substrate material. For example, the semiconductor substrate 12 may be a Si substrate. The semiconductor substrate 12 may have a thickness of, for example, 200 μm or greater and 1500 μm or less. In the drawings (e.g., FIG. 2) showing the XYZ axes that are orthogonal to one another, the Z-axis direction is orthogonal to the main surface of the semiconductor substrate 12. Unless otherwise indicated, the term "plan view" as used in this specification will refer to a view of the nitride semiconductor device 10 taken from above in the Z-axis direction.

The buffer layer 14 may include one or more nitride semiconductor layers. The electron transit layer 16 may be formed on the buffer layer 14. The buffer layer 14 may be formed from any material that limits warping of the semiconductor substrate 12 or cracking of the nitride semiconductor device 10 that would be caused by a difference in coefficient of thermal expansion between the semiconductor substrate 12 and the electron transit layer 16. For example, the buffer layer 14 may include at least one of an aluminum nitride (AlN) layer, an aluminum gallium nitride (AlGaN) layer, and a graded AlGaN layer of different aluminum (Al) compositions. For example, the buffer layer 14 may be a single AlN layer, a single AlGaN layer, a layer having an AlGaN/GaN superlattice structure, a layer having an AlN/AlGaN superlattice structure, or a layer having an AlN/GaN superlattice structure.

In one example, the buffer layer 14 includes a first buffer layer, formed on the semiconductor substrate 12, and a second buffer layer, formed on the first buffer layer. The first buffer layer may be, for example, an AlN layer having a thickness of 200 nm, and the second buffer layer may be, for example, a stack of graded AlGaN layers having a thickness of 300 nm. To reduce leakage current in the buffer layer 14, part of the buffer layer 14 may include an impurity to be semi-insulative. In this case, the impurity may be carbon (C) or iron (Fe), and the concentration of the impurity may be, for example, $4 \times 10^{16}$ cm$^{-3}$ or greater.

The electron transit layer 16 is composed of a nitride semiconductor and may be, for example, a GaN layer. The electron transit layer 16 may have a thickness of, for example, 0.5 μm or greater and 2 μm or less. To reduce leakage current in the electron transit layer 16, part of the electron transit layer 16 may include an impurity so that regions other than the outermost part of the electron transit layer 16 is semi-insulative. In this case, the impurity may be, for example, carbon, and the concentration of the impurity in the electron transit layer 16 may be, for example, $4 \times 10^{16}$ cm$^{-3}$ or greater.

The electron supply layer 18 is composed of a nitride semiconductor having a larger band gap than the electron transit layer 16 and may be, for example an AlGaN layer. In an AlGaN layer, the band gap will become larger as the Al composition increases. Thus, the electron supply layer 18, which is an AlGaN layer, will have a larger band gap than the electron transit layer 16, which is a GaN layer. For example, the electron supply layer 18 is composed of $Al_xGa_{1-x}N$, where x is $0<x<0.3$, and more preferably, $0.1<x<0.3$. The electron supply layer 18 may have a thickness of, for example, 5 nm or greater and 20 nm or less.

The electron transit layer 16 and the electron supply layer 18 may be composed of nitride semiconductors having different lattice constants. Thus, the nitride semiconductor (e.g., GaN) of the electron transit layer 16 and the nitride semiconductor (e.g., AlGaN) of the electron supply layer 18 form a lattice-mismatched heterojunction. The spontaneous polarization of the electron transit layer 16 and the electron supply layer 18 and the piezoelectric polarization caused by crystal distortion near the heterojunction interface causes the energy level of the conduction band of the electron transit layer 16 to be lower than the Fermi level in the proximity of the heterojunction interface. Thus, a two-dimensional electron gas (2DEG) 20 spreads in the electron transit layer 16 at a location proximate to (e.g., distanced by approximately a few nanometers from interface) the heterojunction interface of the electron transit layer 16 and the electron supply layer 18.

The nitride semiconductor device 10 further includes a gate layer 22 formed on the electron supply layer 18, a gate electrode 24 formed on the gate layer 22, and a passivation layer 26 that covers the electron supply layer 18, the gate layer 22, and the gate electrode 24.

The gate layer 22 is composed of a nitride semiconductor containing an acceptor impurity. The gate layer 22 is formed on part of the electron supply layer 18. For example, when the electron supply layer 18 is an AlGaN layer, the gate layer 22 is a GaN layer doped with an acceptor impurity, that is, a p-type GaN layer. The acceptor impurity may contain, for example, at least one of zinc (Zn), magnesium (Mg), and carbon (C). The maximum concentration of the acceptor impurity in the gate layer 22 is, for example, $7\times10^{18}$ cm$^{-3}$ or greater and $1\times10^{20}$ cm$^{-3}$ or less. The thickness of the gate layer 22 may be determined taking into consideration various parameters such as the gate withstand voltage. For example, the gate layer 22 may have a thickness of 80 nm or greater and 150 nm or less.

The gate electrode 24 is formed by one or more metal layers. For example, the gate electrode 24 may be formed by a titanium nitride (TiN) layer. Alternatively, the gate electrode 24 may be formed by a first metal layer of Ti (e.g. Ti layer) and a second metal layer (e.g. TiN layer) applied to the first metal layer. The gate electrode 24 is formed on part of or all of the upper surface of the gate layer 22. The gate electrode 24 and the gate layer 22 may form a Schottky junction. The thickness of the gate electrode 24 may be determined taking into consideration various parameters such as the gate withstand voltage. For example, the gate electrode 24 may have a thickness of 50 nm or greater and 200 nm or less. The passivation layer 26 may be composed of, for example, at least one of silicon nitride (SiN), silicon dioxide (SiO$_2$), silicon oxynitride (SiON), alumina (Al$_2$O$_3$), AlN, and aluminum oxynitride (AlON). The passivation layer 26 may have a thickness of, for example, 80 nm or greater and 150 nm or less. The passivation layer 26 includes a first opening 26A and a second opening 26B. The gate layer 22 is located between the first opening 26A and the second opening 26B.

The nitride semiconductor device 10 includes a source electrode 28 and a drain electrode 30, which are arranged on the electron supply layer 18, and a control electrode 32, which is arranged on the passivation layer 26 between the gate electrode 24 and the drain electrode 30. The source electrode 28 contacts the electron supply layer 18 through the first opening 26A. The drain electrode 30 contacts the electron supply layer 18 through the second opening 26B.

The source electrode 28, the drain electrode 30, and the control electrode 32 may be formed by, for example, one or more metal layers including at least one of a Ti layer, a TiN layer, an Al layer, an AlSiCu layer, and an AlCu layer. For example, the source electrode 28, the drain electrode 30, and the control electrode 32 may be formed from the same material. This is advantageous in that the source electrode 28, the drain electrode 30, and the control electrode 32 can be formed in the same processing step.

The first opening 26A of the passivation layer 26 is filled with part of the source electrode 28. In the same manner, the second opening 26B of the passivation layer 26 is filled with part of the drain electrode 30. The source electrode 28 and the drain electrode 30 are in ohmic contact with the 2DEG 20 underneath the electron supply layer 18 through the first opening 26A and the second opening 26B.

The control electrode 32 is physically separated from the source electrode 28 and the drain electrode 30. The control electrode 32 may be located between the gate layer 22 and the drain electrode 30, closer to the gate layer 22. For example, the end of the control electrode 32 that is closer to the drain electrode 30 may be located toward the gate layer 22 from a middle position between the gate layer 22 and the part of the second opening 26B that is closest to the control electrode 32. The distance separating the control electrode 32 and the drain electrode 30 is increased to avoid the application of a high voltage to the passivation layer 26 and the electron supply layer 18 underneath the control electrode 32. An example of such a high voltage is a surge momentarily applied to the drain electrode 30. This avoids dielectric breakdown of the passivation layer 26 and the electron supply layer 18.

As shown in FIG. 2, the voltage E from the power source 8 is applied between the source electrode 28 and the drain electrode 30. Further, the first control voltage Vg from the control circuit 100 (refer to FIG. 1) is applied to the gate electrode 24. As described above, the first control voltage Vg is a pulse voltage (refer to FIG. 5) and variable between, for example, the first voltage level V1 of the positive voltage (voltage Vcc1) and the second voltage level V2 of the ground voltage (voltage GND2). When the first control voltage Vg is applied to the gate electrode 24, a gate-source voltage Vgs, which is applied between the gate electrode 24 and the source electrode 28, shifts as the first control voltage Vg shifts. Accordingly, the first control voltage Vg controls the gate-source voltage Vgs.

In the structure of the nitride semiconductor device 10 shown in FIG. 2, the gate layer 22, containing the acceptor impurity, is located under the gate electrode 24. In this structure, when the first control voltage Vg applied to the gate electrode 24 results in the gate-source voltage Vgs exceeding a positive threshold voltage, the channel formed by the 2DEG 20 in the region of the electron transit layer 16 underneath the gate layer 22 electrically connects the source and drain. When the gate-source voltage Vgs does not exceed the threshold voltage, the 2DEG 20 will be depleted from the region of the electron transit layer 16 underneath the gate layer 22 (refer to FIG. 2). This is because the gate layer 22, which does not contain the acceptor impurity, will raise the energy level of the electron transit layer 16 and the electron supply layer 18 thereby depleting the 2DEG 20. Thus, the nitride semiconductor device 10 is a normally-off HEMT.

The second control voltage Vcont from the control circuit 100 (refer to FIG. 1) is applied to the control electrode 32. As described above, the second control voltage Vcont is a pulse voltage (refer to FIG. 5) applied between the control electrode 32 and the source electrode 28 and variable between, for example, the third voltage level V3 of the ground voltage (voltage GND2) and the fourth voltage level V4 of the negative voltage (voltage obtained by inverting polarity of voltage Vcc2).

As shown in FIG. 2, the wiring that supplies the gate electrode 24 with the first control voltage Vg includes one or more resistors. Two resistors Rg0 and Rg1 are shown in the example of FIG. 2 to aid understanding. The resistor Rg1 may be a resistor element arranged in the control circuit 100 (first control voltage generator 102) of FIG. 1. The resistor Rg1 is one example of a first resistor. The resistor Rg0 may be a parasitic resistance in the wiring that supplies the first control voltage Vg.

The rising speed and the falling speed of the first control voltage Vg, that is, the shifting period of the first control voltage Vg, may be adjusted with the resistors Rg0 and Rg1. For example, the resistance of the resistor Rg1 may be set taking into consideration the resistance of the resistor Rg0 in order to obtain the desired rising and falling inclinations of the first control voltage Vg.

In the same manner, the wiring that supplies the control electrode 32 with the second control voltage Vcont includes one or more resistors. Two resistors Rc0 and Rc1 are shown in the example of FIG. 2 to aid understanding. The resistor Rc1 may be a resistor element arranged in the control circuit 100 (second control voltage generator 104) of FIG. 1. The resistor Rc1 is one example of a second resistor. The resistor Rc0 may be a parasitic resistance in the wiring that supplies the second control voltage Vcont.

The rising speed and the falling speed of the second control voltage Vcont, that is, the shifting period of the second control voltage Vcont, may be adjusted with the resistors Rc0 and Rc1. For example, the resistance of the resistor Rc1 may be set taking into consideration the resistance of the resistor Rg0 in order to obtain the desired rising and falling inclinations of the first control voltage Vg.

In the first embodiment, the resistance of each of the resistors Rg1, Rg0, Rc1, and Rc0 may be determined so that the shifting period of the second control voltage Vcont is shorter than the shifting period of the first control voltage Vg, that is, the inclination of the second control voltage Vcont is steeper than the inclination of the first control voltage Vg. For example, the resistor Rc1 may be set to have a smaller resistance than the resistor Rg1 so that the total resistance of the resistors Rc1 and Rc0 is smaller than the total resistance of the resistors Rg1 and Rg0.

3. Planar Layout of Nitride Semiconductor Device

Figure 3:
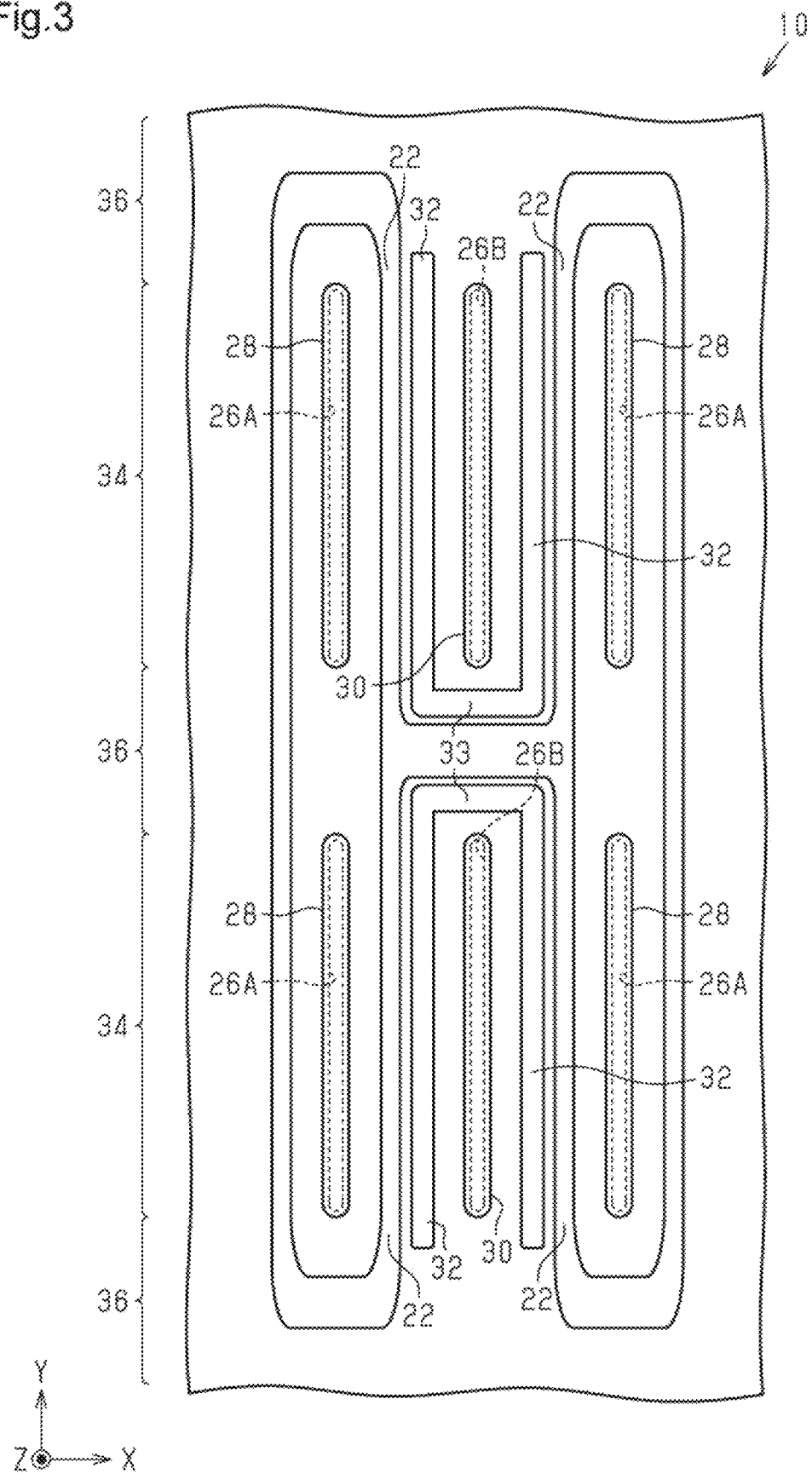
FIG. 3 is a schematic plan view of the nitride semiconductor device illustrated in FIG. 2.
Figure 4:
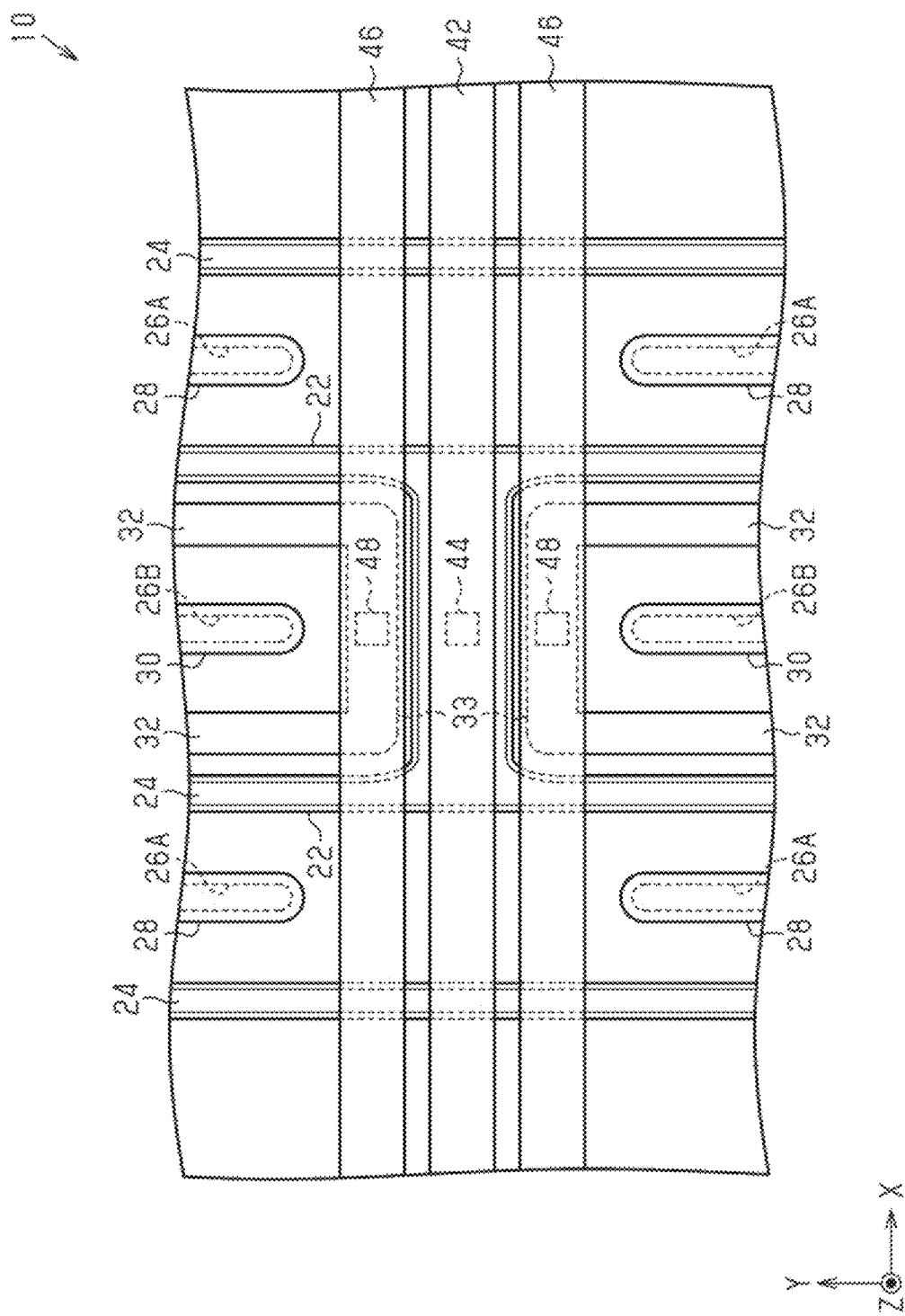
FIG. 4 is a partially enlarged view of FIG. 3.

With reference to FIGS. 3 and 4, the planar layout of the nitride semiconductor device 10 will now be described. FIG. 3 is a schematic plan view of the nitride semiconductor device 10 illustrated in FIG. 2, and FIG. 4 is a partially enlarged view of FIG. 3. For the sake of brevity and to aid understanding, the gate electrode 24 is not shown in FIG. 3. Further, in FIGS. 3 and 4, the passivation layer 26 is not shown, and the first opening 26A and the second opening 26B are illustrated in broken lines.

As shown in FIG. 3, the nitride semiconductor device 10 includes active regions 34, which contribute to a transistor operation, and non-active regions 36, which do not contribute to a transistor operation. In the example of FIG. 3, the active regions 34 and the non-active regions 36 are alternately arranged in the Y-axis direction. The drain electrode 30 is formed in the active region 34. The active region 34 may extend over substantially the same range in the Y-axis direction as the drain electrode 30. The non-active region 36 may extend over a range in the Y-axis direction where the drain electrode 30 does not exist. Thus, the non-active region 36 is adjacent to the active region 34 in the Y-axis direction.

The nitride semiconductor device 10 may act as a HEMT by arranging the source electrode 28, the gate layer 22 on which the gate electrode 24 (not shown in FIG. 3) is arranged, and the drain electrode 30 next to one another in the same direction (X-axis direction in FIG. 3) in the active region 34. FIG. 3 shows two first openings 26A symmetrically arranged at opposite sides of the second opening 26B in the X-axis direction in each active region 34. The control electrode 32 is located in the active region 34 between the gate layer 22 and the drain electrode 30.

The nitride semiconductor device 10 may include a control electrode connector 33 arranged in the non-active region 36. The control electrode connector 33 is electrically connected to the control electrode 32. In the example of FIG. 3, the control electrode 32, which extends in the Y-axis direction, is coupled to the control electrode connector 33, which extends in the X-axis direction. The control electrode connector 33 may be arranged on the passivation layer 26 in the same manner as the control electrode 32.

FIG. 4 is a partially enlarged view of FIG. 3. As shown in FIG. 4, the nitride semiconductor device 10 may include gate wiring 42, a gate wiring via 44, control wiring 46, and a control wiring via 48.

In the example of FIG. 4, the gate wiring 42 extends in the X-axis direction. The gate wiring 42 is connected by the gate wiring via 44 to the gate electrode 24. The gate wiring via 44 may be located in a region overlapping the gate wiring 42 and the gate electrode 24 in plan view. The gate wiring 42 and the gate wiring via 44 are separated from the drain electrode 30 in the Y-axis direction, and separated from the control electrode 32 and the control electrode connector 33 in the Y-axis direction. The gate wiring via 44 may extend in the Z-axis direction through the passivation layer 26 (refer to FIG. 2) and an interlayer insulation layer (not shown) formed on the passivation layer 26. The gate wiring 42 is electrically connected to the gate terminal Tg (refer to FIG. 2).

The control wiring 46 extends substantially parallel to the gate wiring 42. The control wiring 46 is connected by the control wiring via 48 to the control electrode connector 33. Accordingly, the control electrode 32 is connected by the control electrode connector 33 and the control wiring via 48 to the control wiring 46. The control wiring via 48 may be located in a region overlapping the control wiring 46 and the control electrode connector 33 in plan view. The control wiring 46 and the control wiring via 48 are separated from the drain electrode 30 in the Y-axis direction. The control wiring via 48 may extend through the interlayer insulation layer (not shown) formed on the passivation layer 26 (refer to FIG. 2) in the Z-axis direction. The control wiring 46 is electrically connected to the control terminal Tc (refer to FIG. 2).

4. Relationship of Reverse Transfer Capacitance and Drain-Source Voltage in HEMT Structure The HEMT includes the parasitic capacitances of a gate-source capacitance, a gate-drain capacitance, and a drain-source capacitance. Among these parasitic capacitances, the gate-drain capacitance corresponding to the reverse transfer capacitance is a parameter that directly affects the switching speed, that is, the shifting period (rising speed and falling speed) of the drain-source voltage.

Figure 7:
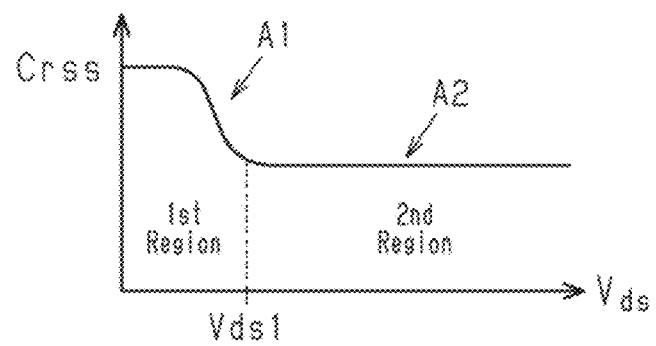
FIG. 7 is a schematic diagram illustrating the relationship between the reverse transfer capacitance and the drain-source voltage in a HEMT.

FIG. 7 is a schematic diagram showing the relationship of the reverse transfer capacitance Crss and the drain-source voltage Vds.

As shown in FIG. 7, the reverse transfer capacitance Crss has dependency on the drain-source voltage Vds (hereafter referred to as Vds dependency). The value of the reverse transfer capacitance Crss is roughly divided into a value of a first region A1, corresponding to a region in which the drain-source voltage Vds is relatively low (hereafter referred to as the low Vds region), and a value of a second region A2, corresponding to a region in which the drain-source voltage Vds is relatively high (hereafter referred to as the high Vds region).

In the first region A1, the drain-source voltage Vds is less than voltage Vds1, and the reverse transfer capacitance Crss is relatively large. In the first region A1, the reverse transfer capacitance Crss increases exponentially as the drain-source voltage Vds decreases. In the second region A2, the drain-source voltage Vds is greater than or equal to voltage Vds1, and the reverse transfer capacitance Crss is relatively small.

In the second region A2, the Vds dependency of the reverse transfer capacitance Crss is small or substantially null. The reverse transfer capacitance Crss in the second region A2 is smaller than the reverse transfer capacitance Crss in the first region A1. Although voltage Vds1 is dependent on the withstand voltage design and the like, when applied to a power transistor of which the voltage E (refer to FIG. 2) is 48 V, voltage Vds1 will be about 10V.

As described above, the reverse transfer capacitance Crss affects the shifting of the drain-source voltage Vds. The reverse transfer capacitance Crss is relatively large in the first region A1. Thus, the percentage of the charge amount of the reverse transfer capacitance Crss of the first region A1 is large in the total charge amount of the reverse transfer capacitance Crss of the first and second regions A1 and A2. In one example, when the HEMT is driven with, for example, 48 V, the percentage of the first region A1 may be 50% or greater of the total of the first and second regions A1 and A2. Thus, the percentage of the first region A1 increases in the total of the first and second regions A1 and A2 as the reverse transfer capacitance Crss becomes larger. This lengthens the shifting period of the drain-source voltage Vds and restricts the shifting period.

5. Switching Control Using Control Electrode (Second Control Voltage)

Figure 5:
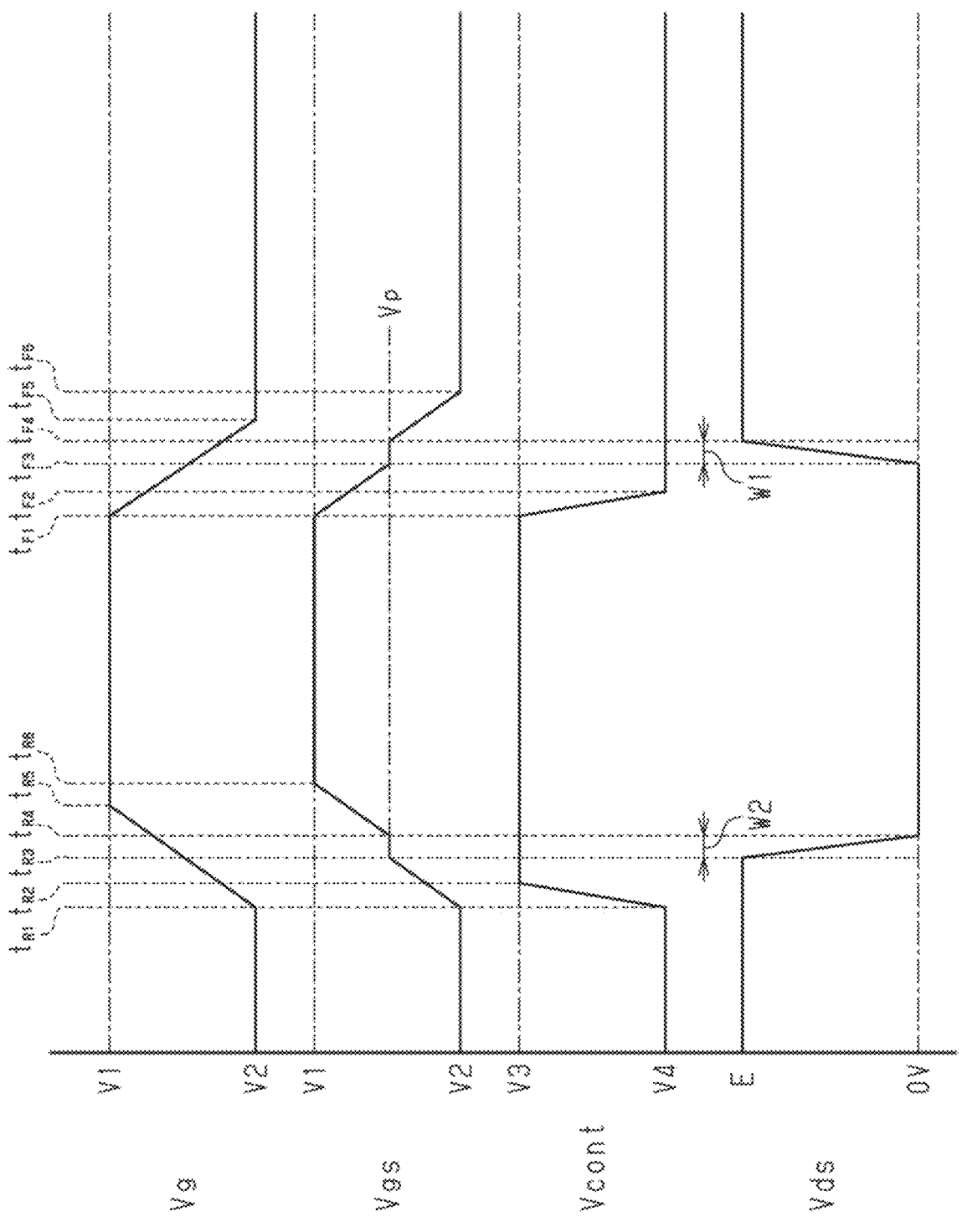
FIG. 5 is an exemplary time chart illustrating a turn-on operation and a turn-off operation during switching control in the first embodiment.

With reference to FIG. 5, switching control using the control electrode 32 (refer to FIG. 2) and the gate electrode 24 (refer to FIG. 2) will now be described.

FIG. 5 is an exemplary time chart illustrating a turn-on operation and a turn-off operation of the nitride semiconductor device 10 (HEMT) in accordance with the first embodiment. In FIG. 5, waveforms and shifting times may be illustrated in an exaggerated manner to aid understanding and clearly show the characteristics.

A turn-on operation in this specification refers to an operation in which the second control voltage Vcont rises in a cycle linked with the rising of the first control voltage Vg and switches the HEMT from an off state to an on state. A turn-off operation in this specification refers to an operation in which the second control voltage Vcont falls in a cycle linked with the falling of the first control voltage Vg and switches the HEMT from an on state to an off state.

5-1. Turn-Off Operation

A turn-off operation of the nitride semiconductor device 10 (HEMT) will now be described. As described above, the first control voltage Vg applied to the gate electrode 24 and the second control voltage Vcont applied to the control electrode 32 are used to control the turn-off operation. A turn-off operation starts at time $t_{F1}$ in FIG. 5.

The first control voltage Vg and the gate-source voltage Vgs are maintained at the first voltage level V1 before time $t_{F1}$. In the example of FIG. 5, the first voltage level V1 is a positive voltage level (e.g., 5 V) corresponding to the voltage Vcc1, and the second voltage level V2 is a ground voltage level (0 V) corresponding to the voltage GND2. When the gate-source voltage Vgs is maintained at the first voltage level V1, the 2DEG 20 forms a channel in the region of the electron transit layer 16 underneath the gate layer 22. Thus, the HEMT is on, and the drain-source voltage Vds is 0 V.

The second control voltage Vcont is maintained at the third voltage level V3 before time $t_{F1}$. In the example of FIG. 5, the third voltage level V3 is a ground voltage level (0 V) of the voltage GND2, and the fourth voltage level V4 is a negative voltage level (e.g., −5V) obtained by inverting the polarity of the voltage Vcc2 of the positive voltage level. The second control voltage Vcont is maintained at the third voltage level V3, which is the ground voltage level, to obtain an effect that expands a depletion layer from the control electrode 32 toward the 2DEG 20 underneath the control electrode 20 when a high voltage, such as a surge, is applied to the drain electrode 30. Thus, electric field concentration in the drain-source region is limited, and dielectric breakdown is avoided in the electron supply layer 18 and the passivation layer 26. This allows the drain-source withstand voltage to be increased.

At time $t_{F1}$, the first control voltage Vg starts to fall from the first voltage level V1 to the second voltage level V2. As the first control voltage Vg starts to fall, the gate-source voltage Vgs also starts to fall from the first voltage level V1 to the second voltage level V2. Thus, the decrease in the first control voltage Vg decreases the gate-source voltage Vgs.

Further, at time $t_{F1}$, the second control voltage Vcont starts to fall from the third voltage level V3 to the fourth voltage level V4. Thus, the first control voltage Vg and the second control voltage Vcont start to fall simultaneously at time $t_{F1}$.

In this specification, simultaneous does not have to mean exactly the same time and may mean substantially the same time in which there is a slight difference in time. For example, when the difference in time is 1 ns or less, this will mean the same time.

At time $t_{F2}$, the second control voltage Vcont stops falling from the third voltage level V3 to the fourth voltage level V4. In the first embodiment, the second control voltage Vcont is generated so that the falling inclination of the second control voltage Vcont is steeper than the falling inclination of the first control voltage Vg. Thus, at time $t_{F2}$, the falling of the first control voltage Vg has not yet ended. Accordingly, the falling of the gate-source voltage Vgs has not yet ended.

At time $t_{F3}$, the gate-source voltage Vgs reaches the plateau voltage Vp, and the drain-source voltage Vds starts to increase. Thus, the drain-source voltage Vds starts to rise at time $t_{F3}$. This starts charging the gate-drain capacitance (reverse transfer capacitance Crss).

At time $t_{F4}$, the drain-source voltage Vds reaches the level of the voltage E. Thus, the drain-source voltage Vd stops rising at time $t_{F4}$. The rise-shifting period W1 of the drain-source voltage Vds corresponds to the period during which the gate-source voltage Vgs coincides with the plateau voltage Vp (time $t_{F3}$-$t_{F4}$). Subsequently, at time $t_{F5}$, the first control voltage Vg falls to the second voltage level V2. Then, at time $t_{F6}$, the gate-source voltage Vgs falls to the second voltage level V2.

In a turn-off operation such as that described above, the fourth voltage level V4 of the second control voltage Vcont, which is applied to the control electrode 32, is a negative voltage level that is lower than the third voltage level V3 (ground voltage level). Thus, in contrast with when the second control voltage Vcont of the third voltage level V3 is applied to the control electrode 32, that is, before the turn-off operation starts, the potential difference between the control electrode 32 and the drain electrode 30 can be increased. This accelerates depletion of the 2DEG 20 in the region beneath the control electrode 32. It is desirable that accelerated depletion completely or substantially deplete the 2DEG 20 beneath the control electrode 32. Nevertheless, a state in which depletion is advanced by the application of the second control voltage Vcont of the fourth voltage level V4 will be sufficient.

As described above, the control electrode 32 is arranged on the passivation layer 26 between the gate electrode 24 (gate layer 22) and the drain electrode 30. The 2DEG 20 in the region underneath the control electrode 32 affects the gate-drain capacitance that corresponds to the reverse transfer capacitance Crss. Taking this point into account, immediately after the turn-off operation, the second control voltage Vcont of the fourth voltage level V4 is applied to the control electrode 32 to deplete the 2DEG 20 in the region underneath the control electrode 32. This decreases the gate-drain capacitance (reverse transfer capacitance Crss) and decreases the percentage of the first region A1 in the total of the first and second regions A1 and A2.

As shown in FIG. 5, the shifting completion time (time $t_{F2}$) of the second control voltage Vcont is earlier than the shifting completion time (time $t_{F5}$) of the first control voltage Vg. In one example, the first control voltage Vg and the second control voltage Vcont start to fall simultaneously, and the second control voltage Vcont stops falling before the first control voltage Vg. Accordingly, the falling inclination of the second control voltage Vcont is steeper than the falling inclination of the first control voltage Vg. Thus, the 2DEG 20 in the region underneath the control electrode 32 is depleted before the gate-source voltage Vgs starts to raise the drain-source voltage Vds. As a result, the gate-drain capacitance (reverse transfer capacitance Crss) is decreased, and the rise-shifting period W1 of the drain-source voltage Vds is shortened.

5-2. Turn-on Operation

A turn-on operation of the nitride semiconductor device 10 (HEMT) will now be described. In the same manner as a turn-off operation, the first control voltage Vg applied to the gate electrode 24 and the second control voltage Vcont applied to the control electrode 32 are used to control the turn-on operation. A turn-on operation starts at time $t_{R1}$ in FIG. 5.

The first control voltage Vg and the gate-source voltage Vgs are maintained at the second voltage level V2 (ground voltage level) before time $t_{R1}$. In the nitride semiconductor device 10, which is a normal-off HEMT, when the gate-source voltage Vgs is maintained at the second voltage level V2, the 2DEG 20 is not formed in the electron transit layer 16 underneath the gate layer 22. Thus, the HEMT is off, and the drain-source voltage Vds is the level of the voltage E.

The second control voltage Vcont is maintained at the fourth voltage level V4 (negative voltage level) before time $t_{R1}$. The second control voltage Vcont being maintained at the fourth voltage level V4, which is the negative voltage level, increases the potential difference between the control electrode 32 and the drain electrode 30. This allows depletion of the 2DEG 20 to be accelerated in the region beneath the control electrode 32.

At time $t_{R1}$, the first control voltage Vg starts to rise from the second voltage level V2 to the first voltage level V1. As the first control voltage Vg starts to rise, the gate-source voltage Vgs also starts to rise from the second voltage level V2 to the first voltage level V1. Thus, the increase in the first control voltage Vg increases the gate-source voltage Vgs.

Further, at time $t_{R1}$, the second control voltage Vcont starts to rise from the fourth voltage level V4 to the third voltage level V3 (ground voltage level). Thus, the first control voltage Vg and the second control voltage Vcont start to rise simultaneously at time $t_{R1}$.

At time $t_{R2}$, the second control voltage Vcont ends rising from the fourth voltage level V4 to the third voltage level V3. This ends the control of depletion with the fourth voltage level V4 and forms the 2DEG 20 in the region of the electron transit layer 16 beneath the control electrode 32. In the first embodiment, the second control voltage Vcont is generated so that the rising inclination of the second control voltage Vcont is steeper than the rising inclination of the first control voltage Vg. Thus, at time $t_{R2}$, the rising of the first control voltage Vg has not yet ended. Accordingly, the rising of the gate-source voltage Vgs has not yet ended.

At time $t_{R3}$, the gate-source voltage Vgs reaches the plateau voltage Vp, and the drain-source voltage Vds starts to decrease. Thus, the drain-source voltage Vds starts to fall at time $t_{R3}$. This starts charging the gate-drain capacitance (reverse transfer capacitance Crss).

At time $t_{R4}$, the drain-source voltage Vds reaches the ground voltage level (0 V). Thus, the drain-source voltage Vds ends its falling at time $t_{R4}$. The fall-shifting period W2 of the drain-source voltage Vds corresponds to the period during which the gate-source voltage Vgs coincides with the plateau voltage Vp (time $t_{R3}$-$t_{R4}$). Subsequently, at time $t_{R5}$, the first control voltage Vg rises to the first voltage level V1. Then, at time $t_{R6}$, the gate-source voltage Vgs rises to the first voltage level V1.

In a turn-off operation such as that described above, before the first control voltage Vg starts rising, that is before the turn-on operation starts, the second control voltage Vcont of the fourth voltage level V4 (negative voltage level) is applied to the control electrode 32. This accelerates the depletion of the 2DEG 20 in the region beneath the control electrode 32 and decreases the gate-drain capacitance (reverse transfer capacitance Crss).

As shown in FIG. 5, the shifting completion time (time $t_{R2}$) of the second control voltage Vcont is earlier than the shifting completion time (time $t_{R5}$) of the first control voltage Vg. In one example, the first control voltage Vg and the second control voltage Vcont start to rise simultaneously, and the second control voltage Vcont ends its rising before the first control voltage Vg. Accordingly, the rising inclination of the second control voltage Vcont is steeper than the rising inclination of the first control voltage Vg. Thus, the 2DEG 20 in the region underneath the control electrode 32 is depleted before the gate-source voltage Vgs starts to lower the drain-source voltage Vds. As a result, the gate-drain capacitance (reverse transfer capacitance Crss) is decreased, and the fall-shifting period W2 of the drain-source voltage Vds is shortened.

6. Switching Control Without Control Electrode (Comparative Example)

Figure 6:
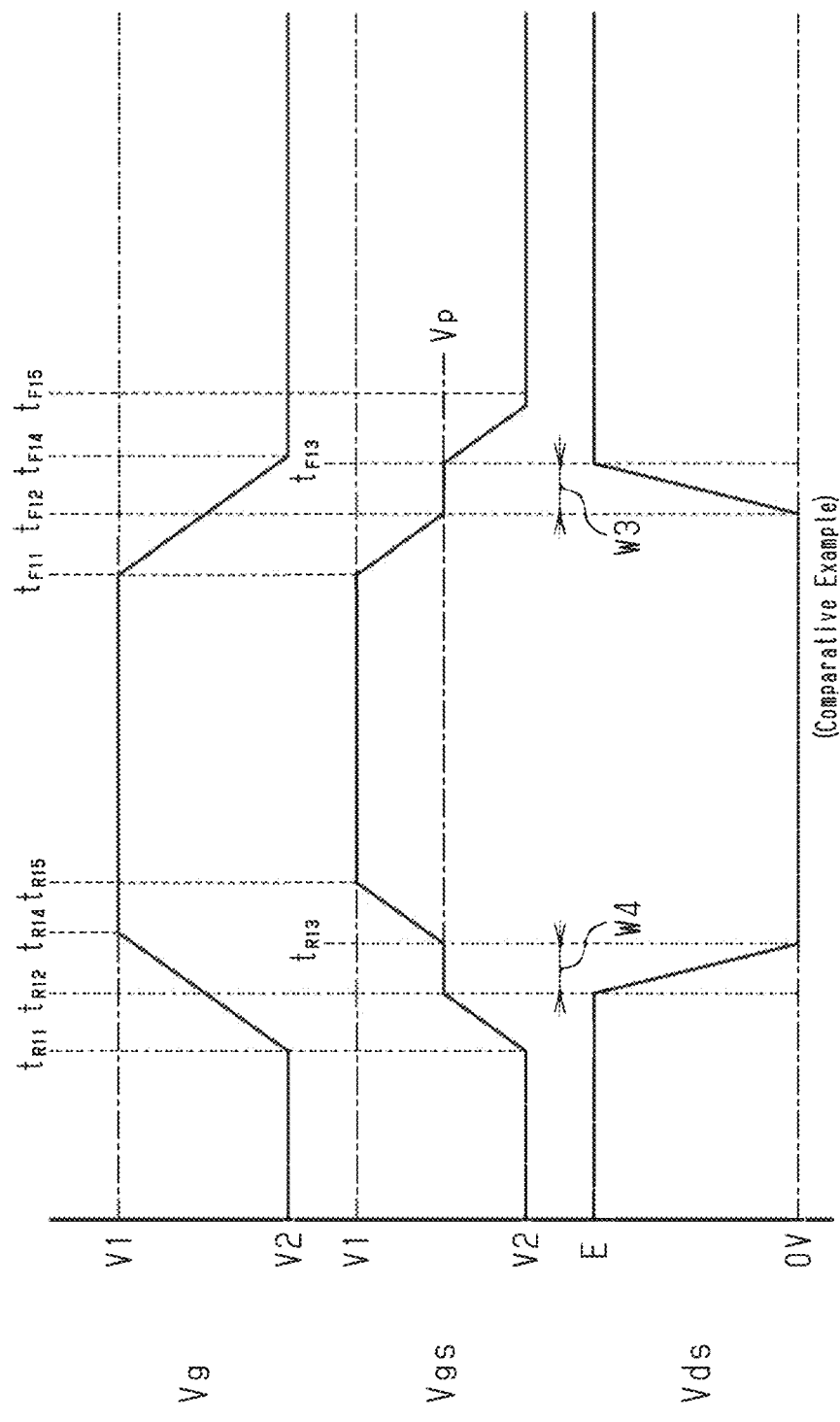
FIG. 6 is an exemplary time chart illustrating a turn-on operation and a turn-off operation during switching control in a comparative example.

FIG. 6 illustrates a turn-on operation and a turn-off operation during switching control performed without the control electrode 32 (second control voltage Vcont) in an example compared with FIG. 5. To aid understanding, in FIG. 6, same reference characters are given to those elements that are the same as the corresponding elements shown in FIG. 5.

6-1. Turn-Off Operation of Comparative Example

The turn-off operation will now be described. The turn-off operation is controlled by the control voltage Vg applied to the gate electrode 24. A turn-off operation starts at time $t_{F11}$ in FIG. 6.

At time $t_{F11}$, the control voltage Vg starts to fall. As the control voltage Vg starts to fall, the gate-source voltage Vgs also starts to fall. At time $t_{F12}$, the gate-source voltage Vgs reaches the plateau voltage Vp, and the drain-source voltage Vds starts to increase. At time $t_{F13}$, the drain-source voltage Vds reaches the level of the voltage E. Subsequently, at time $t_{F14}$, the control voltage Vg falls to the second voltage level V2. Then, at time $t_{F15}$, the gate-source voltage Vgs falls to the second voltage level V2.

The turn-off control illustrated in FIG. 6 does not use the control electrode 32 (second control voltage Vcont). Thus, the 2DEG 20 in the gate-drain region is not depleted immediately after the turn-off operation starts. As a result, the gate-drain capacitance (reverse transfer capacitance Crss) is not decreased. Accordingly, the rise-shifting period W3 of the drain-source voltage Vds in FIG. 6 is longer than the rise-shifting period W1 of the turn-off operation illustrated in FIG. 5.

6-2. Turn-on Operation of Comparative Example

The turn-on operation will now be described. The turn-on operation is controlled by the control voltage Vg applied to the gate electrode 24. A turn-off operation starts at time $t_{R11}$ in FIG. 6.

At time $t_{R11}$, the control voltage Vg starts to rise. As the control voltage Vg starts to rise, the gate-source voltage Vgs also starts to rise. At time $t_{R12}$, the gate-source voltage Vgs reaches the plateau voltage Vp, and the drain-source voltage Vds starts to decrease. At time $t_{R13}$, the drain-source voltage Vds reaches the ground level. Subsequently, at time $t_{R14}$, the control voltage Vg rises to the first voltage level V1. Then, at time $t_{R15}$, the gate-source voltage Vgs rises to the first voltage level V1.

The turn-on control illustrated in FIG. 6 does not use the control electrode 32 (second control voltage Vcont). Thus, the 2DEG 20 in the gate-drain region is not depleted before the turn-on operation starts. As a result, the gate-drain capacitance (reverse transfer capacitance Crss) is not decreased. Accordingly, the fall-shifting period W4 of the drain-source voltage Vds in FIG. 6 is longer than the fall-shifting period W2 of the turn-on operation illustrated in FIG. 5.

7. Operation of Nitride Semiconductor Module

The nitride semiconductor module 1 includes the nitride semiconductor device 10 and the control circuit 100 that controls the nitride semiconductor device 10. The nitride semiconductor device 10 includes the control electrode 32 arranged on the passivation layer 26 between the gate electrode 24 and the drain electrode 30. The first control voltage Vg is applied to the gate electrode 24. The first control voltage Vg controls the gate-source voltage Vgs applied between the gate electrode 24 and the source electrode 28. The second control voltage Vcont is applied between the control electrode 32 and the source electrode 28.

During a turn-off operation, the first control voltage Vg and the second control voltage Vcont fall in a manner linked with each other. The first control voltage Vg shifts from the first voltage level V1 (e.g., positive voltage level) to the second voltage level V2 (e.g., ground voltage level), which is lower than the first voltage level V1. The second control voltage Vcont shifts from the third voltage level V3 (e.g., ground voltage level) to the fourth voltage level V4 (e.g., negative voltage level), which is lower than the third voltage level V3. The second control voltage Vcont of the fourth voltage level V4 is applied to the control electrode 32 in the turn-off operation to increase the potential difference between the control electrode 32 and the drain electrode 30. This accelerates depletion of the 2DEG 20 in the region underneath the control electrode 32.

The first control voltage Vg and the second control voltage Vcont are generated so that the fall-shifting completion time of the second control voltage Vcont (time $t_{F2}$ in FIG. 5) is earlier than the fall-shifting completion time of the first control voltage Vg (time $t_{F5}$ in FIG. 5). Thus, the 2DEG 20 in the region underneath the control electrode 32 is depleted before the first control voltage Vg (gate-source voltage Vgs) starts to raise the drain-source voltage Vds. This decreases the gate-drain capacitance (reverse transfer capacitance Crss) and shortens the rise-shifting period W1 of the drain-source voltage Vds.

During a turn-on operation, the first control voltage Vg and the second control voltage Vcont rise in a manner linked with each other. The first control voltage Vg shifts from the second voltage level V2 to the first voltage level V1, and the second control voltage Vcont shifts from the fourth voltage level V4 to the third voltage level V3. The second control voltage Vcont of the fourth voltage level V4 is applied to the control electrode 32 before the turn-on operation to increase the potential difference between the control electrode 32 and the drain electrode 30. This accelerates depletion of the 2DEG 20 in the region underneath the control electrode 32.

The first control voltage Vg and the second control voltage Vcont are generated so that the rising end time of the second control voltage Vcont (time $t_{R2}$ in FIG. 5) is earlier than the rising end time of the first control voltage Vg (time $t_{R5}$ in FIG. 5). Thus, the 2DEG 20 in the region underneath the control electrode 32 is depleted before the first control voltage Vg (gate-source voltage Vgs) starts to lower the drain-source voltage Vds. This decreases the gate-drain capacitance (reverse transfer capacitance Crss) and shortens the fall-shifting period W2 of the drain-source voltage Vds.

8. Application Example of Nitride Semiconductor Module

The nitride semiconductor module 1 is applicable to, for example, a half-bridge module formed as a back converter. A half-bridge module (not shown) includes, for example, a high-side switch, a low-side switch that is connected in series to the high-side switch, and a drive circuit that turns on and off the two switches in a complementary manner.

In such a half-bridge module, for example, the nitride semiconductor device 10 may be applied to the high-side switch, and the drive circuit may implement the functionality of the control circuit 100. As described above, the nitride semiconductor device 10 shortens the rise-shifting period W1 and the fall-shifting period W2 of the drain-source voltage Vds thereby allowing for high-speed switching. Thus, application of the nitride semiconductor device 10 to the high-side switch will improve the functionality of the back converter. The nitride semiconductor device 10 can be applied to the low-side switch. However, in a back converter, the low-side switch functions as a synchronous rectification element. Thus, the nitride semiconductor device 10 does not necessarily have to be applied to the low-side switch.

The nitride semiconductor device 10 of the first embodiment has the advantages described below.

(1-1) The control circuit 100 generates the first control voltage Vg and the second control voltage Vcont. During a turn-off operation, the first control voltage Vg and the second control voltage Vcont fall in a manner linked with each other. The first control voltage Vg and the second control voltage Vcont are generated so that the fall-shifting completion time of the second control voltage Vcont from the third voltage level V3 to the fourth voltage level V4 (time $t_{F2}$ in FIG. 5) is earlier than the fall-shifting completion time of the first control voltage Vg from the first voltage level V1 to the second voltage level V2 (time $t_{F5}$ in FIG. 5). With this configuration, in the turn-off operation, the 2DEG 20 in the region underneath the control electrode 32 is depleted before the first control voltage Vg (gate-source voltage Vgs) starts to raise the drain-source voltage Vds. This decreases the gate-drain capacitance (reverse transfer capacitance Crss) and shortens the rise-shifting period W1 of the drain-source voltage Vds.

(1-2) During a turn-off operation, the fall-shifting initiation time of the first control voltage Vg (time $t_{F1}$ in FIG. 5)

may be the same as the fall-shifting initiation time of the second control voltage Vcont (time $t_{F1}$ in FIG. 5). In this case, the shifting period of the second control voltage Vcont (time $t_{F1}$-$t_{F2}$ in FIG. 5) is shorter than the shifting period of the first control voltage Vg (time $t_{F1}$-$t_{F5}$ in FIG. 5). The first control voltage Vg and the second control voltage Vcont start to fall simultaneously. This starts depletion of the 2DEG 20 in the region underneath the control electrode 32 when the turn-off operation starts. Thus, the on-state of the HEMT is maintained in a satisfactory manner.

(1-3) The control circuit 100 generates the first control voltage Vg through the first resistor Rg1, and generates the second control voltage Vcont through the second resistor Rc1. The second resistor Rc1 has a smaller resistance than the first resistor Rg1. In this configuration, the falling inclination of the second control voltage Vcont is steeper than the falling inclination of the first control voltage Vg. Thus, the fall-shifting completion time of the second control voltage Vcont is earlier than the fall-shifting completion time of the first control voltage Vg. As a result, the 2DEG 20 is depleted in the region underneath the control electrode 32, and the reverse transfer capacitance Crss is decreased before the drain-source voltage Vds starts to rise.

(1-4) During a turn-on operation, the first control voltage Vg and the second control voltage Vcont rise in a manner linked with each other. The first control voltage Vg and the second control voltage Vcont are generated so that the rise-shifting completion time of the second control voltage Vcont from the fourth voltage level V4 to the third voltage level V3 (time $t_{R2}$ in FIG. 5) is earlier than the rise-shifting completion time of the first control voltage Vg from the second voltage level V2 to the first voltage level V1 (time $t_{R5}$ in FIG. 5). In this configuration, the 2DEG 20 in the region underneath the control electrode 32 is depleted before the first control voltage Vg (gate-source voltage Vgs) starts to lower the drain-source voltage Vds. This decreases the gate-drain capacitance (reverse transfer capacitance Crss) and shortens the fall-shifting period W2 of the drain-source voltage Vds.

(1-5) During a turn-on operation, the rise-shifting initiation time of the first control voltage Vg (time $t_{R1}$ in FIG. 5) is the same as the rise-shifting initiation time of the second control voltage Vcont (time $t_{R1}$ in FIG. 5). In this case, the shifting period of the second control voltage Vcont (time $t_{R1}$-$t_{R2}$ in FIG. 5) is shorter than the shifting period of the first control voltage Vg (time $t_{R1}$-$t_{R5}$ in FIG. 5). The first control voltage Vg and the second control voltage Vcont start to rise simultaneously. This stops depletion of the 2DEG 20 in the region underneath the control electrode 32 when the turn-off operation starts. Thus, the off-state of the HEMT is maintained in a satisfactory manner.

(1-6) As described above, the second resistor Rc1 has a smaller resistance than the first resistor Rg1. Thus, the rising inclination of the second control voltage Vcont is steeper than the rising inclination of the first control voltage Vg, and the rise-shifting completion time of the second control voltage Vcont is earlier than the rise-shifting completion time of the first control voltage Vg. As a result, depletion of the 2DEG 20 is stopped in the region underneath the control electrode 32 before the drain-source voltage Vds starts to fall, and the reverse transfer capacitance Crss is decreased.

(1-7) The second voltage level V2 of the first control voltage Vg and the third voltage level V3 of the second control voltage Vcont may be the ground voltage level. In this case, the first voltage level V1 of the first control voltage Vg is the positive voltage level, and the fourth voltage level V4 of the second control voltage Vcont is the negative voltage level. In this configuration, the second control voltage Vcont of the fourth voltage level V4 is applied to the control electrode 32 to increase the potential difference between the control electrode 32 and the drain electrode 30. This accelerates depletion of the 2DEG 20 in the region underneath the control electrode 32.

(1-8) The nitride semiconductor device 10 includes the gate layer 22 composed of a nitride semiconductor containing an acceptor impurity, and the gate electrode 24 is arranged on the gate layer 22. In this case, the nitride semiconductor device 10 forms a normally-off HEMT. A normally-off HEMT will increase the switching speed.

(1-9) In the nitride semiconductor device 10, the electron transit layer 16 may be a GaN layer, and the electron supply layer 18 may be an AlGaN layer. In this case, the normally-off GaN-HEMT will increase the switching speed.

(1-10) The control electrode 32 is arranged on the passivation layer 26 between the gate electrode 24 (gate layer 22) and the drain electrode 30. In an on-state (time $t_{R6}$-$t_{F1}$ in example of FIG. 5), the control electrode 32 maintains, for example, the third voltage level V3 corresponding to the ground voltage level. In this configuration, the control electrode 32 expands the depletion layer toward the 2DEG 20 underneath the control electrode 32 where the high voltage of the drain electrode 30 is applied. This limits electric field concentration in the drain-source region. Thus, dielectric breakdown of the electron supply layer 18 and the passivation layer 26, which would be caused by local electric field concentration, is avoided. This allows the drain-source withstand voltage to be increased.

Second Embodiment

Figure 8:
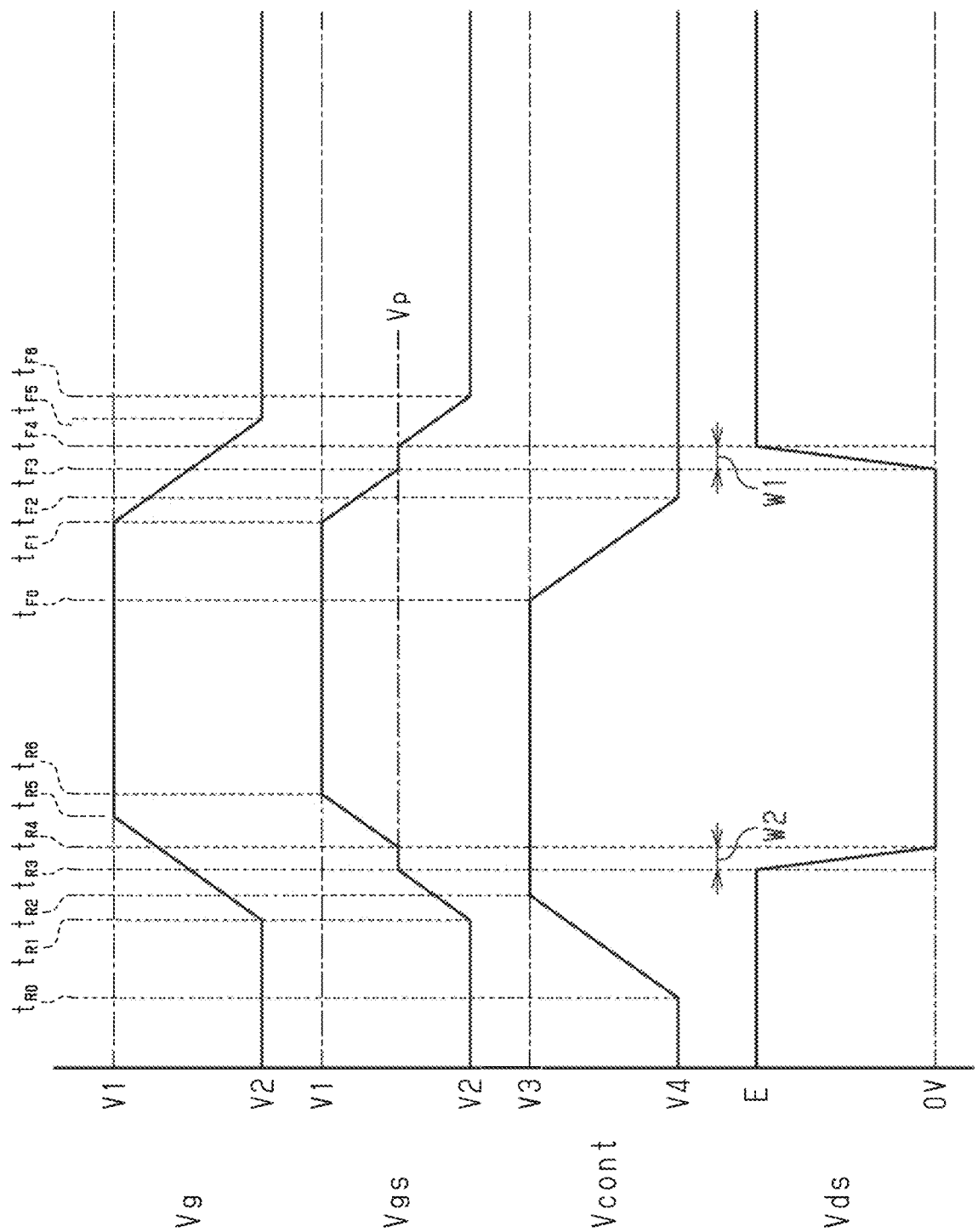
FIG. 8 is an exemplary time chart illustrating a turn-on operation and a turn-off operation during switching control in a second embodiment.

A second embodiment will now be described with reference to FIG. 8. The second embodiment differs from the first embodiment only in the time at which the second control voltage Vcont is shifted, as illustrated in FIG. 5, to perform a turn-on operation and a turn-off operation. Elements that are the same as the corresponding elements in the first embodiment will not be described in detail. The description will focus on differences from the first embodiment. In FIG. 8, same reference characters are given to those elements that are the same as the corresponding elements of the first embodiment.

FIG. 8 is an exemplary time chart illustrating a turn-on operation and a turn-off operation in the second embodiment. In FIG. 8, waveforms and shifting times may be illustrated in an exaggerated manner to aid understanding and clearly show characteristics.

The turn-off operation will now be described.

A turn-off operation starts at time $t_{F0}$ in FIG. 8. At time $t_{F0}$, the second control voltage Vcont starts to fall from the third voltage level V3 to the fourth voltage level V4. Time $t_{F0}$ is earlier than time $t_{F1}$ at which the first control voltage Vg starts to fall from the first voltage level V1 to the second voltage level V2. The falling inclination of the second control voltage Vcont may be the same as the falling inclination of the first control voltage Vg. In this case, the fall-shifting period of the first control voltage Vg (time $t_{F1}$-$t_{F5}$) is the same as the fall-shifting period of the second control voltage Vcont (time $t_{F0}$-$t_{F2}$). Thus, the fall-shifting completion time of the second control voltage Vcont is earlier than the fall-shifting completion time of the first control voltage Vg.

The turn-on operation will now be described.

A turn-on operation starts at time $t_{R0}$ in FIG. 8. At time $t_{R0}$, the second control voltage Vcont starts to rise from the fourth voltage level V4 to the third voltage level V3. Time $t_{R0}$, is earlier than time $t_{R1}$, at which the first control voltage Vg starts to rise from the second voltage level V2 to the first voltage level V1. The rising inclination of the second control voltage Vcont may be the same as the rising inclination of the first control voltage Vg. In this case, the rise-shifting period of the first control voltage Vg (time $t_{R1}$-$t_{R5}$) is the same as the rise-shifting period of the second control voltage Vcont (time $t_{R0}$-$t_{R2}$). Thus, the rise-shifting completion time of the second control voltage Vcont is earlier than the rise-shifting completion time of the first control voltage Vg.

Although FIG. 8 illustrates the turn-off operation with a long time interval between time $t_{F0}$ and time $t_{F1}$, it is preferred that the time interval be as short as possible. In the same manner, it is preferred that the time interval between time $t_{R0}$ and time $t_{R1}$ be as short as possible. The HEMT can be maintained in a satisfactory on state and off state by setting the shortest time interval that is possible.

In the second embodiment, for example, a delay circuit (not shown) is used to delay the pulse of the second control voltage Vcont and generate the first control voltage Vg. The resistors Rg1 and Rc1 (refer to FIG. 2) may be omitted from the control circuit 100 of the first embodiment or be used so that the inclination of the first control voltage Vg coincides with the inclination of the second control voltage Vcont.

In addition to advantages (1-1), (1-4), and (1-7) to (1-10) of the first embodiment, the second embodiment has the advantages described below.

(2-1) During a turn-off operation, the fall-shifting initiation time of the second control voltage Vcont is earlier than the fall-shifting initiation time of the first control voltage Vg. The fall-shifting period of the second control voltage Vcont is the same as the fall-shifting period of the first control voltage Vg. Thus, the fall-shifting completion time of the second control voltage Vcont is earlier than the fall-shifting completion time of the first control voltage Vg. As a result, the 2DEG 20 is depleted in the region underneath the control electrode 32 before the drain-source voltage Vds starts to rise, and the reverse transfer capacitance Crss is decreased.

(2-2) During a turn-off operation, the rise-shifting initiation time of the second control voltage Vcont is earlier than the rise-shifting initiation time of the first control voltage Vg. The rise-shifting period of the second control voltage Vcont is the same as the rise-shifting period of the first control voltage Vg. Thus, the rise-shifting completion time of the second control voltage Vcont is earlier than the rise-shifting completion time of the first control voltage Vg. As a result, depletion of the 2DEG 20 is stopped in the region underneath the control electrode 32 before the drain-source voltage Vds starts to rise, and the reverse transfer capacitance Crss is decreased.

Third Embodiment

Figure 9:
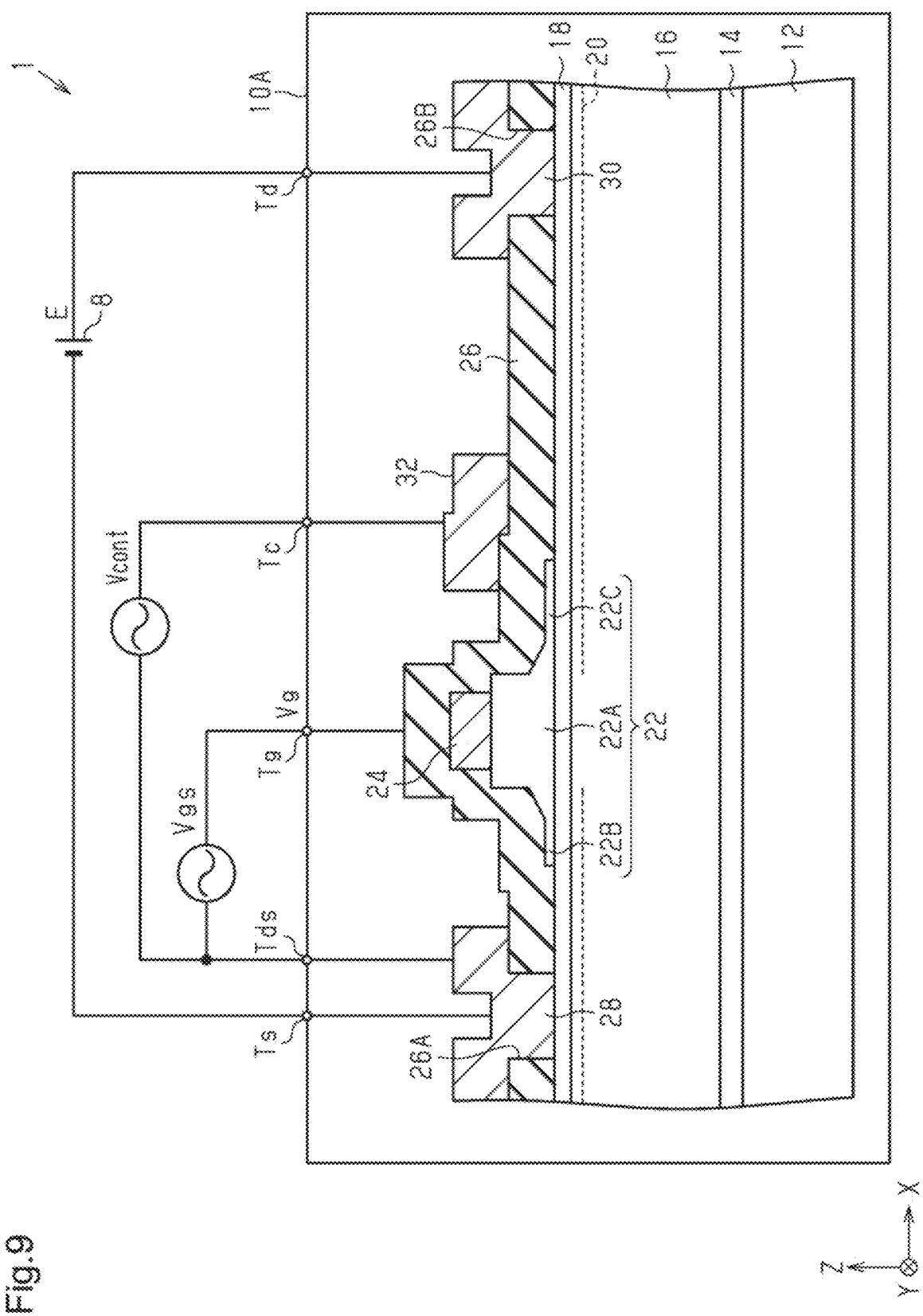
FIG. 9 is a diagram illustrating applied voltages together with the cross-sectional structure of an exemplary nitride semiconductor device in accordance with a third embodiment.

A third embodiment will now be described with reference to FIG. 9. The third embodiment differs from the first embodiment in the gate layer 22 of the nitride semiconductor device 10 illustrated in FIG. 2. Elements that are the same as the corresponding elements in the first embodiment will not be described in detail. The description will focus on differences from the first embodiment. In FIG. 9, same reference characters are given to those elements that are the same as the corresponding elements of the first embodiment.

FIG. 9 is a diagram illustrating applied voltages together with the cross-sectional structure of an exemplary nitride semiconductor device 10A in accordance with a third embodiment.

In the third embodiment, the gate layer 22 has a stepped structure. The gate layer 22 includes a ridge 22A on which the gate electrode 24 is arranged, a source-side extension 22B extending from the ridge 22A toward the first opening 26A of the passivation layer 26, and a drain-side extension 22C extending from the ridge 22A toward the second opening 26B of the passivation layer 26. The ridge 22A and the two extensions 22B and 22C form the stepped structure of the gate layer 22. The ridge 22A corresponds to a gate layer body.

The ridge 22A corresponds to a relatively thick portion of the gate layer 22. The ridge 22A may have a rectangular or substantially rectangular (trapezoidal) cross section extending along an XZ plane in FIG. 9. The ridge 22A may have a thickness of, for example, 80 nm or greater and 150 nm or less. The thickness of the ridge 22A is the distance from the upper surface of the ridge 22A to the lower surface of the ridge 22A (i.e., lower surface of gate layer 22 contacting electron supply layer 18).

The source-side extension 22B extends from a first side surface (left surface in FIG. 9) of the ridge 22A toward the first opening 26A. The source-side extension 22B has a distal end separated from the first opening 26A. The drain-side extension 22C extends from a second side surface (right surface in FIG. 9) of the ridge 22A toward the second opening 26B. The drain-side extension 22C has a distal end separated from the second opening 26B.

In the example of FIG. 9, the length of the drain-side extension 22C from the ridge 22A is greater than that of the source-side extension 22B in plan view. Instead, the source-side extension 22B may have the same length as the drain-side extension 22C. The source-side extension 22B may have a dimension in its extending direction (X-axis direction), or a dimension from the first side surface of the ridge 22A to the distal end of the source-side extension 22B, of, for example, 0.2 µm or greater and 0.3 µm or less. The drain-side extension 22C may have a dimension in its extending direction (X-axis direction), or a dimension from the second side surface of the ridge 22A to the distal end of the drain-side extension 22C, of, for example, 0.2 µm or greater and 1.5 µm or less.

In the example of FIG. 9, the source-side extension 22B and the drain-side extension 22C each include a sloped portion, adjacent to the ridge 22A, and a flat portion, continuous with the sloped portion. Instead, at least one of the source-side extension 22B and the drain-side extension 22C may include only the flat portion or only the sloped portion. The flat portion has a substantially constant thickness. The phrase substantially constant thickness means the thickness varies within a range resulting from manufacturing (e.g., 20%). The source-side extension 22B and the drain-side extension 22C may have a thickness that is, for example, one half the thickness of the ridge 22A or less. The flat portion of the source-side extension 22B and the flat portion of the drain-side extension 22C may have a thickness of, for example, 5 nm or greater and 25 nm or less.

The control electrode 32 may have a dimension (length) in the extending direction of the drain-side extension 22C (X-axis direction) that is greater than that of the drain-side extension 22C. Instead, the same dimension (length) of the control electrode 32 in the X-axis direction may be equal to that of the drain-side extension 22C. The control electrode 32 may have a length in the X-axis direction of, for example, 0.5 µm or greater and 2 µm or less.

The control electrode 32 is located on the passivation layer 26 at a position partially overlapping the drain-side extension 22C in plan view. In the example of FIG. 1, the control electrode 32 slightly overlaps the distal portion of the drain-side extension 22C in plan view. The control electrode 32 does not overlap the entire drain-side extension 22C in plan view, and does not overlap the ridge 22A and the source-side extension 22B in plan view.

In addition to advantages (1-1) to (1-10) of the first embodiment, the third embodiment has the advantages described below.

(3-1) The gate layer 22 includes the ridge 22A, the source-side extension 22B, and the drain-side extension 22C. When a positive bias (first control voltage Vg of first voltage level V1) is applied to the gate electrode 24, the source-side extension 22B and the drain-side extension 22C decrease the electric field intensity at the end of the gate electrode 24 thereby limiting the generation of gate leakage current. This allows the gate withstand voltage to be increased. As a result, the gate noise resistance during high-speed operations can be improved.

(3-2) The control electrode 32 overlaps the distal portion of the drain-side extension 22C (not entire drain-side extension 22C) in plan view. In this configuration, the control electrode 32 is located immediately above the drain-side extension 22C. Thus, the control electrode 32 avoids electric field concentration at the distal portion of the drain-side extension 22C.

(3-3) The control electrode 32 may have a dimension (length) in the extending direction of the drain-side extension 22C (X-axis direction) that is greater than that of the drain-side extension 22C. With this configuration, in the HEMT structure using the gate layer 22 that includes the source-side extension 22B and the drain-side extension 22C, the length of the control electrode 32 in the X-axis direction has a lower limit. This allows the effect for depleting the 2DEG 20 in the region underneath the control electrode 32 to be maintained in a satisfactory state. Further, the gate withstand voltage may be increased.

Modified Examples

The above embodiments may be modified as described below. The above-described embodiments and the modified examples described below may be combined as long as there is no technical contradiction.

The nitride semiconductor is not limited to GaN. The nitride semiconductor devices 10 and 10A may be formed from nitride semiconductors other than GaN. In addition to GaN, examples of nitride semiconductors include nitride aluminum (AlN) and nitride indium (InN). Such compounds may be expressed as $Al_xIn_yGa_{1-x-y}N$ ($0 \leq x \leq 1$, $0 \leq y \leq 1$, $0 \leq x+y \leq 1$).

The fourth voltage level V4 of the second control voltage Vcont may be set to any negative voltage level as long as depletion of the 2DEG 20 in the region underneath the control electrode 32 can be accelerated. For example, depletion will be accelerated when the fourth voltage level V4 is set to a larger negative voltage level. In this case, the third voltage level V3 and the fourth voltage level V4 of the second control voltage Vcont should be set so that the potential difference between the third voltage level V3 and the fourth voltage level V4 of the second control voltage Vcont is the same or substantially the same as the potential difference between the first voltage level V1 and the second voltage level V2 of the first control voltage Vg. In this case, the shifting period of the second control voltage Vcont will not be too long with respect to the shifting period of the gate-source voltage Vgs. This facilitates control of the time at which the 2DEG 20 is depleted in the region underneath the control electrode 32.

The nitride semiconductor devices 10 and 10A are not limited to normally-off HEMT structures and may be normally-on HEMT structures. In such a case, the gate layer 22 may be omitted, and the gate electrode 24 may be arranged on the electron supply layer 18. In the case of a normally-on HEMT structure, for example, the first control voltage Vg may be variable between the first voltage level V1, which corresponds to a ground voltage level, and the second voltage level V2, which corresponds to a negative voltage level (e.g., −5V). The second control voltage Vcont may be variable between the third voltage level V3, which corresponds to a negative voltage level (e.g., −5 V), and the fourth voltage level V4, which corresponds a negative voltage level (e.g., −10 V) that is lower than the third voltage level V3.

In this specification, the word "on" includes the meaning of "above" in addition to the meaning of "on" unless otherwise described in the context. Accordingly, the phrase of "first layer formed on second layer" may mean that the first layer is formed directly contacting the second layer in one embodiment and that the first layer is arranged above the second layer without contacting the second layer in another embodiment. Thus, the word "on" will also allow for a structure in which another layer is formed between the first layer and the second layer. For example, the phrase of the electron supply layer 18 is arranged on the electron transit layer 16 will not only mean that the electron supply layer 18 is directly arranged on the electron transit layer 16 like in the above embodiments but will also mean that an intermediate layer may be located between the electron supply layer 18 and the electron transit layer 16 to stably form the 2DEG 20. Further, for example, the phrase of the gate electrode 24 is arranged on the electron supply layer 18 will not only include the normally-off gate structure of each of the above embodiments in which the gate layer 22 is located between the gate electrode 24 and the electron supply layer 18 but also include the normally-on gate structure in which the gate electrode 24 is arranged on the electron supply layer 18.

The Z-axis direction referred to in this specification does not necessarily have to be the vertical direction and does not necessarily have to exactly coincide with the vertical direction. Accordingly, in the structures disclosed above (e.g., structure shown in FIG. 1), upward and downward in the Z-axis direction as referred to in this specification is not limited to upward and downward in the vertical direction. For example, the X-axis direction may be the vertical direction. Alternatively, the Y-axis direction may be the vertical direction.

The terms used in this specification to indicate directions such as vertical, horizontal, upward, downward, up, down, forward, rearward, side, left, right, front, and back will be attributed to specific directions of the described and illustrated device. In this specification, a variety of alternative directions may be available for any given direction. Thus, directional terms should not be construed narrowly.

Technical concepts that can be understood from each of the above embodiments and modified examples will now be described. The reference characters used to denote elements of the embodiments are shown in parenthesis for the corresponding elements of the clauses described below. The reference characters are given as examples to aid understanding and not intended to limit elements to the elements denoted by the reference characters.

CLAUSES

[Clause 1]

A nitride semiconductor module (1), including:
a nitride semiconductor device (10; 10A) that forms a transistor; and
a control circuit (100) that is configured to control the nitride semiconductor device (10; 10A),
the nitride semiconductor device (10: 10A) including:
an electron transit layer (16) composed of a nitride semiconductor;
an electron supply layer (18) arranged on the electron transit layer (16) and composed of a nitride semiconductor having a band gap that is larger than that of the electron transit layer (16);
a source electrode (28), a gate electrode (24), and a drain electrode (30) that are arranged on the electron supply layer (18);
a passivation layer (26) that covers the electron supply layer (18) and the gate electrode (24); and
a control electrode (32) arranged on the passivation layer (26) between the gate electrode (24) and the drain electrode (30),
the control circuit (100) being configured to generate:
a first control voltage (Vg) that is variable between a first voltage level (V1) and a second voltage level (V2) that is lower than the first voltage level (V1) to control a voltage (Vgs) applied between the gate electrode (24) and the source electrode (28); and
a second control voltage (Vcont) that is variable between a third voltage level (V3) and a fourth voltage level (V4) that is lower than the third voltage level (V3) to apply between the control electrode (32) and the source electrode (28), and
the control circuit (100) being configured to generate the first control voltage (Vg) and the second control voltage (Vcont) so that, during a turn-off operation of the transistor, a shifting completion time ($t_{F2}$) of the second control voltage (Vcont) from the third voltage level (V3) to the fourth voltage level (V4) is earlier than a shifting completion time ($t_{F5}$) of the first control voltage (Vg) from the first voltage level (V1) to the second voltage level (V2).

[Clause 2]

The nitride semiconductor module (1) according to clause 1, where:
a shifting initiation time ($t_{F1}$) of the first control voltage (Vg) from the first voltage level (V1) to the second voltage level (V2) is the same as a shifting initiation time ($t_{F1}$) of the second control voltage (Vcont) from the third voltage level (V3) to the fourth voltage level (V4); and
a shifting period ($t_{F1}$-$t_{F2}$) of the second control voltage (Vcont) from the third voltage level (V3) to the fourth voltage level (V4) is shorter than a shifting period ($t_{F1}$-$t_{F5}$) of the first control voltage (Vg) from the first voltage level (V1) to the second voltage level (V2).

[Clause 3]

The nitride semiconductor module (1) according to clause 1, where:
a shifting initiation time ($t_{F1}$) of the first control voltage (Vg) from the first voltage level (V1) to the second voltage level (V2) is the same as a shifting initiation time ($t_{F1}$) of the second control voltage (Vcont) from the third voltage level (V3) to the fourth voltage level (V4); and the control circuit (100) includes a first resistor (Rg1) connected to the gate electrode (24) and a second resistor (Rc1) connected to the control electrode (32), the control circuit (100) being configured to generate the first control voltage (Vg) with the first resistor (Rg1) and generate the second control voltage (Vcont) with the second resistor (Rc1); and
the second resistor (Rc1) has a resistance that is smaller than that of the first resistor (Rg1).

[Clause 4]

The nitride semiconductor module (1) according to clause 1, where:
a shifting initiation time ($t_{F0}$) of the second control voltage (Vcont) from the third voltage level (V3) to the fourth voltage level (V4) is earlier than a shifting initiation time ($t_{F1}$) of the first control voltage (Vg) from the first voltage level (V1) to the second voltage level (V2); and
a shifting period ($t_{F1}$-$t_{F5}$) of the first control voltage (Vg) from the first voltage level (V1) to the second voltage level (V2) is the same as a shifting period ($t_{F0}$-$t_{F2}$) of the second control voltage (Vcont) from the third voltage level (V3) to the fourth voltage level (V4).

[Clause 5]

The nitride semiconductor module (1) according to any one of clauses 1 to 4, where the control circuit (100) is configured to generate the first control voltage (Vg) and the second control voltage (Vcont) so that, during a turn-on operation of the transistor, a shifting completion time ($t_{R2}$) of the second control voltage (Vcont) from the fourth voltage level (V4) to the third voltage level (V3) is earlier than a shifting completion time ($t_{R5}$) of the first control voltage (Vg) from the second voltage level (V2) to the first voltage level (V1).

[Clause 6]

The nitride semiconductor module (1) according to clause 5, where:
a shifting initiation time ($t_{R1}$) of the first control voltage (Vg) from the second voltage level (V2) to the first voltage level (V1) is the same as a shifting initiation time ($t_{R1}$) of the second control voltage (Vcont) from the fourth voltage level (V4) to the third voltage level (V3); and
a shifting period ($t_{R1}$-$t_{R2}$) of the second control voltage (Vcont) from the fourth voltage level (V4) to the third voltage level (V3) is shorter than a shifting period ($t_{R1}$-$t_{R5}$) of the first control voltage (Vg) from the second voltage level (V2) to the first voltage level (V1).

[Clause 7]

The nitride semiconductor module (1) according to clause 5, where:
a shifting initiation time ($t_{R0}$) of the second control voltage (Vcont) from the fourth voltage level (V4) to the third voltage level (V3) is earlier than a shifting initiation time ($t_{R1}$) of the first control voltage (Vg) from the second voltage level (V2) to the first voltage level (V1); and
a shifting period ($t_{R1}$-$t_{R5}$) of the first control voltage (Vg) from the second voltage level (V2) to the first voltage level (V1) is the same as a shifting period ($t_{R0}$-$t_{R2}$) of the second control voltage (Vcont) from the fourth voltage level (V4) to the third voltage level (V3).

[Clause 8]
The nitride semiconductor module (1) according to any one of clauses 1 to 7, where:
each of the second voltage level (V2) of the first control voltage (Vg) and the third voltage level (V3) of the second control voltage (Vcont) is a ground voltage level;
the first voltage level (V1) of the first control voltage (Vg) is a positive voltage level; and
the fourth voltage level (V4) of the second control voltage (Vcont) is a negative voltage level.

[Clause 9]
The nitride semiconductor module (1) according to any one of clauses 1 to 8, wherein:
the nitride semiconductor device (10; 10A) further includes a gate layer (22) arranged on the electron supply layer and composed of a nitride semiconductor containing an acceptor impurity; and
the gate electrode (24) is arranged on the gate layer (22).

[Clause 10]
The nitride semiconductor module (1) according to clause 9, where:
the passivation layer (26) includes a first opening (26A) and a second opening (26B);
the source electrode (28) contacts the electron supply layer (18) through the first opening (26A);
the drain electrode (30) contacts the electron supply layer (18) through the second opening (26B);
the gate layer (22) includes
a gate layer body (22A) on which the gate electrode (24) is located,
a source-side extension (22B) extending from the gate layer body (22A) toward the first opening (26A), and
a drain-side extension (22A) extending from the gate layer body (22A) toward the second opening (26B).

[Clause 11]
The nitride semiconductor module (1) according to any one of clauses 1 to 10, where:
the electron transit layer is a GaN layer; and
the electron supply layer is an $Al_xGa_{1-x}N$ layer, where x is a value in a range of 0<x<0.3.

[Clause 12]
A nitride semiconductor module (1), including:
a nitride semiconductor device (10; 10A) that forms a transistor; and
a control circuit (100) that is configured to control the nitride semiconductor device (10; 10A),
the nitride semiconductor device (10: 10A) including:
an electron transit layer (16) composed of a nitride semiconductor;
an electron supply layer (18) arranged on the electron transit layer (16) and composed of a nitride semiconductor having a band gap that is larger than that of the electron transit layer (16);
a source electrode (28), a gate electrode (24), and a drain electrode (30) that are arranged on the electron supply layer (18);
a passivation layer (26) that covers the electron supply layer (18) and the gate electrode (24); and
a control electrode (32) arranged on the passivation layer (26) between the gate electrode (24) and the drain electrode (30),
the control circuit (100) being configured to generate:
a first control voltage (Vg) that is variable between a first voltage level (V1) and a second voltage level (V2) that is lower than the first voltage level (V1) to control a voltage (Vgs) applied between the gate electrode (24) and the source electrode (28); and
a second control voltage (Vcont) that is variable between a third voltage level (V3) and a fourth voltage level (V4) that is lower than the third voltage level (V3) to apply between the control electrode (32) and the source electrode (28), and
the control circuit (100) being configured to generate the first control voltage (Vg) and the second control voltage (Vcont) so that, during a turn-on operation of the transistor, a shifting completion time ($t_{R2}$) of the second control voltage (Vcont) from the fourth voltage level (V4) to the third voltage level (V3) is earlier than a shifting completion time ($t_{R5}$) of the first control voltage (Vg) from the second voltage level (V2) to the first voltage level (V1).

[Clause 13]
The nitride semiconductor module (1) according to clause 12, where:
a shifting initiation time ($t_{R1}$) of the first control voltage (Vg) from the second voltage level (V2) to the first voltage level (V1) is the same as a shifting initiation time ($t_{R1}$) of the second control voltage (Vcont) from the fourth voltage level (V4) to the third voltage level (V3); and
a shifting period ($t_{R1}$-$t_{R2}$) of the second control voltage (Vcont) from the fourth voltage level (V4) to the third voltage level (V3) is shorter than a shifting period ($t_{R1}$-$t_{R5}$) of the first control voltage (Vg) from the second voltage level (V2) to the first voltage level (V1).

[Clause 14]
The nitride semiconductor module (1) according to clause 12, where:
a shifting initiation time ($t_{R1}$) of the first control voltage (Vg) from the second voltage level (V2) to the first voltage level (V1) is the same as a shifting initiation time ($t_{R1}$) of the second control voltage (Vcont) from the fourth voltage level (V4) to the third voltage level (V3);
the control circuit (100) includes a first resistor (Rg1) connected to the gate electrode (24) and a second resistor (Rc1) connected to the control electrode (32), the control circuit (100) being configured to generate the first control voltage (Vg) with the first resistor (Rg1) and generate the second control voltage (Vcont) with the second resistor (Rc1); and
the second resistor (Rc1) has a resistance that is smaller than that of the first resistor (Rg1).

[Clause 15]
The nitride semiconductor module (1) according to clause 12, where:
a shifting initiation time ($t_{R0}$) of the second control voltage (Vcont) from the fourth voltage level (V4) to the third voltage level (V3) is earlier than a shifting initiation time ($t_{R1}$) of the first control voltage (Vg) from the second voltage level (V2) to the first voltage level (V1); and
a shifting period ($t_{R1}$-$t_{R5}$) of the first control voltage (Vg) from the second voltage level (V2) to the first voltage level (V1) is the same as a shifting period ($t_{R0}$-$t_{R2}$) of the second control voltage (Vcont) from the fourth voltage level (V4) to the third voltage level (V3).

[Clause 16]

The nitride semiconductor module (1) according to any one of clauses 12 to 14, where:
each of the second voltage level (V2) of the first control voltage (Vg) and the third voltage level (V3) of the second control voltage (Vcont) is a ground voltage level;
the first voltage level (V1) of the first control voltage (Vg) is a positive voltage level; and
the fourth voltage level (V4) of the second control voltage (Vcont) is a negative voltage level.

[Clause 17]

The nitride semiconductor module (1) according to any one of clauses 12 to 16, where:
the nitride semiconductor device (10; 10A) further includes a gate layer (22) arranged on the electron supply layer and composed of a nitride semiconductor containing an acceptor impurity; and
the gate electrode (24) is arranged on the gate layer (22).

[Clause 18]

The nitride semiconductor module (1) according to clause 17, where:
the passivation layer (26) includes a first opening (26A) and a second opening (26B);
the source electrode (28) contacts the electron supply layer (18) through the first opening (26A);
the drain electrode (30) contacts the electron supply layer (18) through the second opening (26B);
the gate layer (22) includes
a gate layer body (22A) on which the gate electrode (24) is located,
a source-side extension (22B) extending from the gate layer body (22A) toward the first opening (26A), and
a drain-side extension (22A) extending from the gate layer body (22A) toward the second opening (26B).

[Clause 19]

The nitride semiconductor module (1) according to any one of clauses 12 to 18, where:
the electron transit layer is a GaN layer; and
the electron supply layer is an $Al_xGa_{1-x}N$ layer, where x is a value in a range of 0<x<0.3.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A nitride semiconductor module, comprising:
a nitride semiconductor device that forms a transistor; and
a control circuit that is configured to control the nitride semiconductor device,
wherein the nitride semiconductor device includes:
an electron transit layer composed of a nitride semiconductor;
an electron supply layer arranged on the electron transit layer and composed of a nitride semiconductor having a band gap that is larger than that of the electron transit layer;
a source electrode, a gate electrode, and a drain electrode that are arranged on the electron supply layer;
a passivation layer that covers the electron supply layer and the gate electrode; and
a control electrode arranged on the passivation layer between the gate electrode and the drain electrode,
wherein the control circuit is configured to generate:
a first control voltage that is variable between a first voltage level and a second voltage level that is lower than the first voltage level to control a voltage applied between the gate electrode and the source electrode; and
a second control voltage that is variable between a third voltage level and a fourth voltage level that is lower than the third voltage level to apply between the control electrode and the source electrode, and
wherein the control circuit is configured to generate the first control voltage and the second control voltage so that, during a turn-off operation of the transistor, a shifting completion time of the second control voltage from the third voltage level to the fourth voltage level is earlier than a shifting completion time of the first control voltage from the first voltage level to the second voltage level.

2. The nitride semiconductor module according to claim 1, wherein:
a shifting initiation time of the first control voltage from the first voltage level to the second voltage level is the same as a shifting initiation time of the second control voltage from the third voltage level to the fourth voltage level; and
a shifting period of the second control voltage from the third voltage level to the fourth voltage level is shorter than a shifting period of the first control voltage from the first voltage level to the second voltage level.

3. The nitride semiconductor module according to claim 1, wherein:
a shifting initiation time of the first control voltage from the first voltage level to the second voltage level is the same as a shifting initiation time of the second control voltage from the third voltage level to the fourth voltage level;
the control circuit includes a first resistor connected to the gate electrode and a second resistor connected to the control electrode, the control circuit being configured to generate the first control voltage with the first resistor and generate the second control voltage with the second resistor; and
the second resistor has a resistance that is smaller than that of the first resistor.

4. The nitride semiconductor module according to claim 1, wherein:
a shifting initiation time of the second control voltage from the third voltage level to the fourth voltage level is earlier than a shifting initiation time of the first control voltage from the first voltage level to the second voltage level; and
a shifting period of the first control voltage from the first voltage level to the second voltage level is the same as a shifting period of the second control voltage from the third voltage level to the fourth voltage level.

5. The nitride semiconductor module according to claim 1, wherein the control circuit is configured to generate the first control voltage and the second control voltage so that, during a turn-on operation of the transistor, a shifting completion time of the second control voltage from the fourth voltage level to the third voltage level is earlier than a shifting completion time of the first control voltage from the second voltage level to the first voltage level.

6. The nitride semiconductor module according to claim 5, wherein:
a shifting initiation time of the first control voltage from the second voltage level to the first voltage level is the same as a shifting initiation time of the second control voltage from the fourth voltage level to the third voltage level; and
a shifting period of the second control voltage from the fourth voltage level to the third voltage level is shorter than a shifting period of the first control voltage from the second voltage level to the first voltage level.

7. The nitride semiconductor module according to claim 5, wherein:
a shifting initiation time of the second control voltage from the fourth voltage level to the third voltage level is earlier than a shifting initiation time of the first control voltage from the second voltage level to the first voltage level; and
a shifting period of the first control voltage from the second voltage level to the first voltage level is the same as a shifting period of the second control voltage from the fourth voltage level to the third voltage level.

8. The nitride semiconductor module according to claim 1, wherein:
each of the second voltage level of the first control voltage and the third voltage level of the second control voltage is a ground voltage level;
the first voltage level of the first control voltage is a positive voltage level; and
the fourth voltage level of the second control voltage is a negative voltage level.

9. The nitride semiconductor module according to claim 1, wherein:
the nitride semiconductor device further includes a gate layer arranged on the electron supply layer and composed of a nitride semiconductor containing an acceptor impurity,
the gate electrode is arranged on the gate layer.

10. The nitride semiconductor module according to claim 9, wherein:
the passivation layer includes a first opening and a second opening;
the source electrode contacts the electron supply layer through the first opening;
the drain electrode contacts the electron supply layer through the second opening; and
the gate layer includes:
a gate layer body on which the gate electrode is located;
a source-side extension extending from the gate layer body toward the first opening; and
a drain-side extension extending from the gate layer body toward the second opening.

11. The nitride semiconductor module according to claim 10, wherein the control electrode is located on the passivation layer at a position partially overlapping the drain-side extension in plan view.

12. The nitride semiconductor module according to claim 1, wherein:
the electron transit layer is a GaN layer; and
the electron supply layer is an $Al_xGa_{1-x}N$ layer, where x is a value in a range of $0<x<0.3$.

13. A nitride semiconductor module, comprising:
a nitride semiconductor device that forms a transistor; and
a control circuit that is configured to control the nitride semiconductor device,
wherein the nitride semiconductor device includes:
an electron transit layer composed of a nitride semiconductor;
an electron supply layer arranged on the electron transit layer and composed of a nitride semiconductor having a band gap that is larger than that of the electron transit layer;
a source electrode, a gate electrode, and a drain electrode that are arranged on the electron supply layer;
a passivation layer that covers the electron supply layer and the gate electrode; and
a control electrode arranged on the passivation layer between the gate electrode and the drain electrode,
wherein the control circuit is configured to generate:
a first control voltage that is variable between a first voltage level and a second voltage level that is lower than the first voltage level to control a voltage applied between the gate electrode and the source electrode; and
a second control voltage that is variable between a third voltage level and a fourth voltage level that is lower than the third voltage level to apply between the control electrode and the source electrode, and
wherein the control circuit is configured to generate the first control voltage and the second control voltage so that, during a turn-on operation of the transistor, a shifting completion time of the second control voltage from the fourth voltage level to the third voltage level is earlier than a shifting completion time of the first control voltage from the second voltage level to the first voltage level.

14. The nitride semiconductor module according to claim 13, wherein:
a shifting initiation time of the first control voltage from the second voltage level to the first voltage level is the same as a shifting initiation time of the second control voltage from the fourth voltage level to the third voltage level; and
a shifting period of the second control voltage from the fourth voltage level to the third voltage level is shorter than a shifting period of the first control voltage from the second voltage level to the first voltage level.

15. The nitride semiconductor module according to claim 13, wherein:
a shifting initiation time of the first control voltage from the second voltage level to the first voltage level is the same as a shifting initiation time of the second control voltage from the fourth voltage level to the third voltage level;
the control circuit includes a first resistor connected to the gate electrode and a second resistor connected to the control electrode, the control circuit being configured to generate the first control voltage with the first resistor and generate the second control voltage with the second resistor; and
the second resistor has a resistance that is smaller than that of the first resistor.

16. The nitride semiconductor module according to claim 13, wherein:
a shifting initiation time of the second control voltage from the fourth voltage level to the third voltage level is earlier than a shifting initiation time of the first control voltage from the second voltage level to the first voltage level; and a shifting period of the first control voltage from the second voltage level to the first voltage level is the same as a shifting period of the second control voltage from the fourth voltage level to the third voltage level.

17. The nitride semiconductor module according to claim 13, wherein:
    each of the second voltage level of the first control voltage and the third voltage level of the second control voltage is a ground voltage level;
    the first voltage level of the first control voltage is a positive voltage level; and
    the fourth voltage level of the second control voltage is a negative voltage level.

18. The nitride semiconductor module according to claim 13, wherein:
    the nitride semiconductor device further includes a gate layer arranged on the electron supply layer and composed of a nitride semiconductor containing an acceptor impurity; and
    the gate electrode is arranged on the gate layer.

19. The nitride semiconductor module according to claim 18, wherein:
    the passivation layer includes a first opening and a second opening;
    the source electrode contacts the electron supply layer through the first opening;
    the drain electrode contacts the electron supply layer through the second opening;
    the gate layer includes:
        a gate layer body on which the gate electrode is located;
        a source-side extension extending from the gate layer body toward the first opening; and
        a drain-side extension extending from the gate layer body toward the second opening.

20. The nitride semiconductor module according to claim 13, wherein:
    the electron transit layer is a GaN layer; and
    the electron supply layer is an $Al_xGa_{1-x}N$ layer, where x is a value in a range of $0<x<0.3$.

* * * * *